United States Patent
Li et al.

(10) Patent No.: US 12,166,138 B1
(45) Date of Patent: Dec. 10, 2024

(54) SOLAR CELL AND PHOTOVOLTAIC MODULE

(71) Applicants: JINKO SOLAR (HAINING) CO., LTD., Haining (CN); JINKO SOLAR CO., LTD., Jiangxi (CN)

(72) Inventors: Wenqi Li, Haining (CN); Shijie Zhao, Haining (CN); Caijie Qiu, Haining (CN)

(73) Assignees: JINKO SOLAR (HAINING) CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/582,463

(22) Filed: Feb. 20, 2024

(30) Foreign Application Priority Data

Sep. 18, 2023 (CN) .......................... 202311206688.4

(51) Int. Cl.
*H01L 31/02* (2006.01)
*H01L 31/0216* (2014.01)
(Continued)

(52) U.S. Cl.
CPC .. *H01L 31/02008* (2013.01); *H01L 31/02168* (2013.01); *H01L 31/022425* (2013.01);
(Continued)

(58) Field of Classification Search
CPC ......... H01L 31/02008; H01L 31/02168; H01L 31/022425; H01L 31/02366; H01L 31/0475; H01L 31/048
See application file for complete search history.

(56) References Cited

U.S. PATENT DOCUMENTS

| | | | |
|---|---|---|---|
| 10,439,087 | B2 | 10/2019 | Ha et al. |
| 2011/0315188 | A1* | 12/2011 | Hong .................. H01L 31/0512 136/244 |

(Continued)

FOREIGN PATENT DOCUMENTS

| | | |
|---|---|---|
| CN | 104975291 A | 10/2015 |
| CN | 106206822 A | 12/2016 |

(Continued)

OTHER PUBLICATIONS

Jinko Solar (Haining) Co., Ltd., et al., Extended European Search Report, EP 24158693.2, Aug. 28, 2024, 53 pgs.

*Primary Examiner* — Angelo Trivisonno
(74) *Attorney, Agent, or Firm* — USCH Law, PC

(57) ABSTRACT

A solar cell is provided, including a substrate having a first surface and a second surface opposite to each other, an emitter formed on the first surface of the substrate and including a textured structure on a side away from the first surface, a passivation structure formed on the textured structure, first electrodes penetrating the passivation structure and in electrical contact with the textured structure of the emitter, and conductive eutectic layers each formed between a respective first electrode and the emitter and including first conductive particles and second conductive particles. Each of the first conductive particles has a shape different from a shape of any of the second conductive particles. The first conductive particles and the second conductive particles have a first number, the first conductive particles have a second number, and a ratio of the second number to the first number in a range of 20% to 80%.

20 Claims, 9 Drawing Sheets

(51) Int. Cl.
  *H01L 31/0224*  (2006.01)
  *H01L 31/0236*  (2006.01)
  *H01L 31/0475*  (2014.01)
  *H01L 31/048*   (2014.01)
(52) U.S. Cl.
  CPC .... *H01L 31/02366* (2013.01); *H01L 31/0475* (2014.12); *H01L 31/048* (2013.01)

(56) References Cited

U.S. PATENT DOCUMENTS

2016/0155866 A1*  6/2016  Ha .................... H01L 31/02168
                                              136/255
2022/0077331 A1   3/2022  Cho et al.

FOREIGN PATENT DOCUMENTS

| CN | 114188431 A | 3/2022 |
| CN | 115863475 A | 3/2023 |
| CN | 115939254 A | 4/2023 |
| CN | 116759465 A | 9/2023 |

* cited by examiner

SOLAR CELL AND PHOTOVOLTAIC MODULE

CROSS-REFERENCE TO RELATED APPLICATION

The present disclosure claims the benefit of priorities under the Paris Convention to Chinese Patent Application 202311206688.4 filed on Sep. 18, 2023, which is incorporated herein by reference in its entirety.

TECHNICAL FIELD

Embodiments of the present disclosure relate in general to the field of photovoltaics, and in particular to a solar cell and a photovoltaic module.

BACKGROUND

Currently, with gradual depletion of fossil energy sources, solar cells are being used more and more widely as a new energy alternative, which convert light energy from the sun into electrical energy. The solar cells utilize the photovoltaic principle to generate carriers, and then use electrodes to draw the carriers out, thereby facilitating efficient utilization of the electrical energy.

The reasons that affect the performance of the solar cells (such as photovoltaic conversion efficiency) include optical losses and electrical losses. Optical losses include reflective losses on a front surface of the cell, shadowing losses on contact grid lines, and non-absorptive losses in long wavelength bands, etc. Electrical losses include photogenerated carrier composite on a surface of and inside the semiconductor, loss of the contact resistance between the semiconductor and metal grid lines, and loss of the contact resistance between the metal and the semiconductor, etc.

Poor contact performance of the metal and semiconductor further affects improvement of the performance of solar cells.

SUMMARY

Some embodiments of the present disclosure provide a solar cell and a photovoltaic module, which are at least conducive to improving photoelectric conversion efficiency of the solar cell.

Some embodiments of the present disclosure provide a solar cell, including: a substrate having a first surface and a second surface opposite to each other; an emitter formed on the first surface of the substrate, where the emitter includes a textured structure on a side away from the first surface; a passivation structure formed on the textured structure of the emitter; first electrodes penetrating the passivation structure and in electrical contact with the textured structure of the emitter; and conductive eutectic layers, where each of the conductive eutectic layers is formed between a respective first electrode of the first electrodes and the emitter and includes first conductive particles and second conductive particles, and where each of the first conductive particles has a shape different from a shape of any of the second conductive particles, and the first conductive particles have branched shapes or linear shapes; where the first conductive particles and the second conductive particles have a first number, the first conductive particles have a second number, and a ratio of the second number to the first number is in a range of 20% to 80%.

In some embodiments, the ratio of the second number to the first number is in a range of 30% to 70%.

In some embodiments, the textured structure includes at least one protrusion structure having a dimension in a range of 100 nm to 10 um.

In some embodiments, the at least one protrusion structure includes a pyramid shape, a sinusoidal curve shape or a parabolic shape.

In some embodiments, each of the at least one protrusion structure includes a top portion and a bottom portion, the first conductive particles are located at the top portion and the bottom portion, and a number of the first conductive particles located at the top portion is greater than a number of the first conductive particles located at the bottom portion per unit area.

In some embodiments, the first conductive particles have a same material as the second conductive particles.

In some embodiments, the second conductive particles include agglomerates, and each of at least some of the agglomerates has a size in a range of 12 nm to 120 nm.

In some embodiments, the first conductive particles include silver nanoparticles or silver crystalline particles.

In some embodiments, each of at least some of the first conductive particles has a size in a range of 40 nm to 150 nm.

In some embodiments, the solar cell further includes: a tunneling dielectric layer formed on the second surface; a first doped conductive layer formed on the tunneling dielectric layer; a first passivation layer formed on the first doped conductive layer; and second electrodes penetrating the first passivation layer and in electrical contact with the first doped conductive layer.

In some embodiments, the solar cell further includes: an intrinsic passivation layer formed on the second surface; a second doped conductive layer formed on the intrinsic passivation layer; a transparent conductive layer formed on the second doped conductive layer; and second electrodes in electrical contact with the transparent conductive layer.

In some embodiments, the first electrodes and the conductive eutectic layers are prepared on a surface of the passivation structure away from the emitter by a screen printing process as well as an energy injection process.

In some embodiments, the energy injection process includes a laser process. the energy injection process is performed at a region of the passivation structure not overlapped with regions where the first electrodes are formed.

Some embodiments of the present disclosure further provide a photovoltaic module including: at least one cell string each formed by connecting a plurality of solar cells according to any one of the above embodiments; at least one encapsulating adhesive film each configured to cover a surface of a respective cell string; and at least one cover plate each configured to cover a surface of a respective encapsulating adhesive film facing away from the respective cell string.

BRIEF DESCRIPTION OF THE DRAWINGS

One or more embodiments are exemplarily described with figures in the accompanying drawings corresponding thereto, which are not intended to limit these embodiments. Unless otherwise stated, the figures in the accompanying drawings do not constitute scale limitations. In order to more clearly illustrate the technical solutions in the embodiments of the present disclosure or conventional technologies, the accompanying drawings that need to be used in the embodiments are briefly described below, and it is apparent that the drawings in the following description are merely some embodiments of the present disclosure. For a person of ordinary skill in the art, other drawings may also be obtained according to these drawings.

DETAILED DESCRIPTION OF THE EMBODIMENTS

Figure 1:
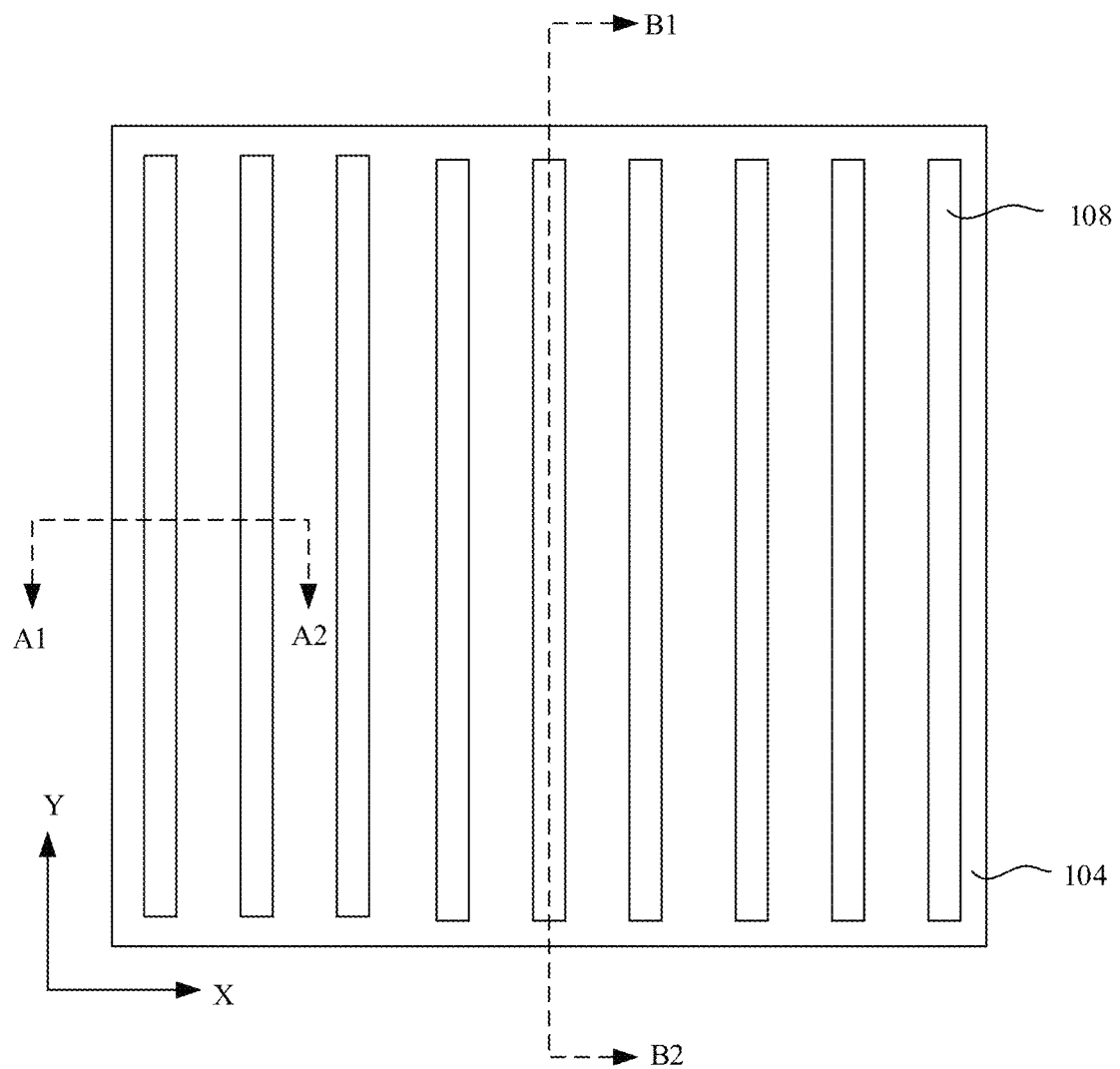
FIG. 1 is a top view of a solar cell according to an embodiment of the present disclosure

As is seen from the Background, photoelectric conversion efficiency of a conventional solar cell is poor.

In the solar cell provided in the embodiments of the present disclosure, ohmic contact is realized between the first electrodes and the emitter by means of the conductive eutectic layers, and the conductive eutectic layers include the first conductive particles and the second conductive particles. The first conductive particles present the linear shape and the branched shape, compared with the agglomerate shape, the linear shape and the branched shape have a larger specific surface area, thereby prompting more contact area between the first conductive particles and the emitter, reducing contact resistances between the conductive eutectic layers and the emitter, reducing electrical losses of the solar cell, and improving the cell efficiency.

In addition, a total number of the first conductive particles and the second conductive particles is the first number, a number of the first conductive particles is the second number, and the ratio of the second number to the first number is in a range of 20% to 80%, so that the contact resistances between the conductive eutectic layers and the emitter is lowered by a large amount, and an open-circuit voltage of the solar cell is improved. Besides, the first conductive particles may be coated by the material of a glass layer and fixed to the surface of the emitter away from the first surface. The number of the first conductive particles also reflects energy as well as a length of time for preparing the first conductive particles, that is, to ensure that a certain number of the first conductive particles are used to reduce the contact resistance, and at the same time to prevent ions constructing the first conductive particles from corroding the textured structure excessively, resulting in the failure of the textured structure, thereby increasing the optical loss.

Moreover, the textured structure is provided on the side of the emitter away from the first surface, and the first conductive particles and the second conductive particles are also disposed on the textured structure. Compared to a flat surface, the contact area between the textured structure and the first conductive particles is increased, and the textured structure also increases the distance between the first conductive particles and the second conductive particles as well as the substrate, that is, the distance between the first conductive particles and the PN junction is increased, thereby avoiding reducing the cell efficiency caused by the first conductive particles penetrating the PN junction.

Various embodiments of the present disclosure are described in detail below in connection with the accompanying drawings. However, a person of ordinary skill in the art can understand that in the various embodiments of the present disclosure, many technical details have been proposed to enable the reader to better understand the present disclosure. However, even without these technical details and various variations and modifications based on the following various embodiments, the technical solution claimed to be protected by the present disclosure is also able to be realized.

Figure 2:
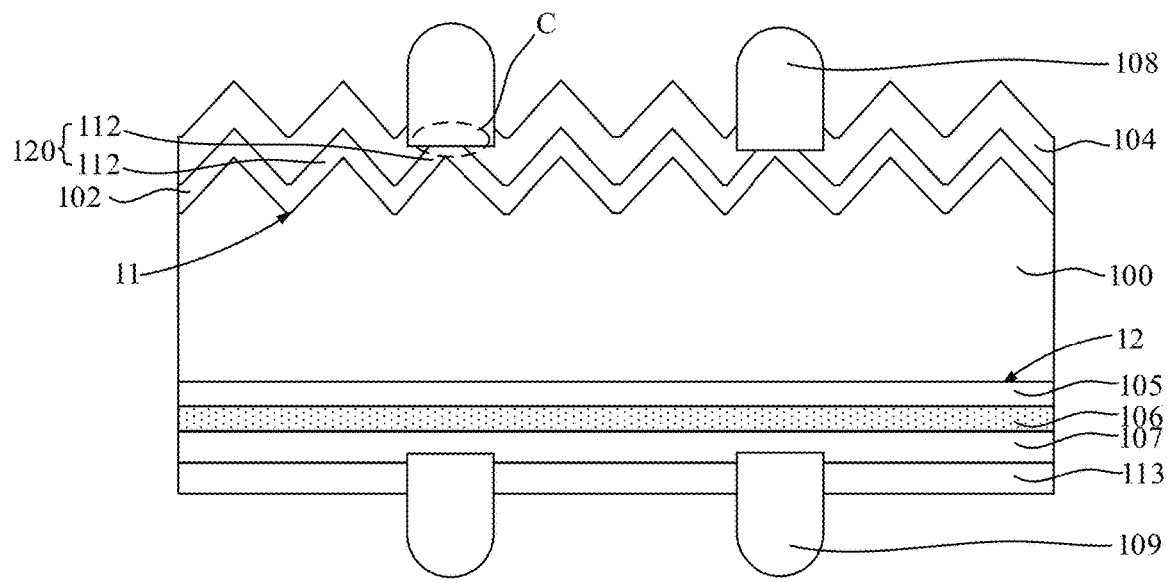
FIG. 2 is a cross-sectional view of FIG. 1 along section A1-A2.
Figure 3:
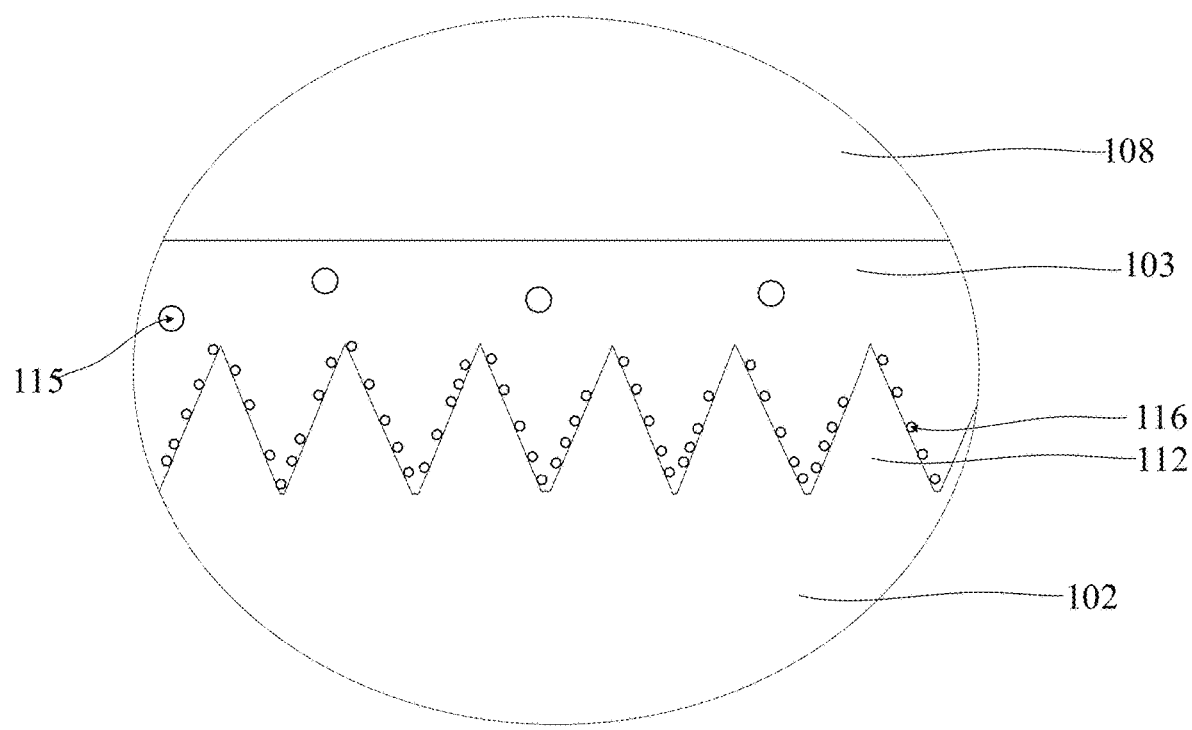
FIG. 3 is an enlarged view of part C in FIG. 2.
Figure 4:
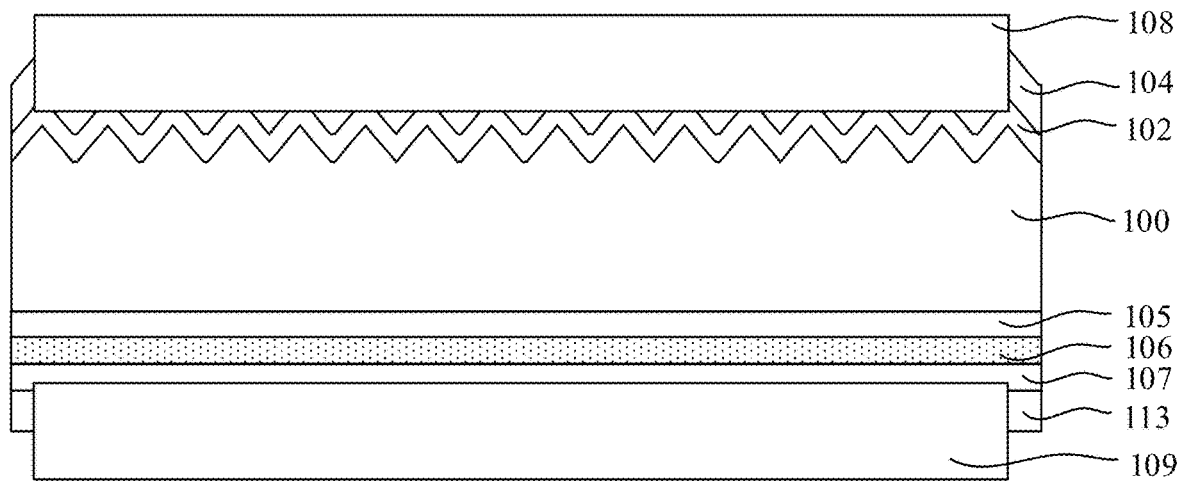
FIG. 4 is a cross-sectional view of FIG. 1 along section B1-B2.

FIG. 1 is a top view of a solar cell according to an embodiment of the present disclosure, FIG. 2 is a cross-sectional view of FIG. 1 along section A1-A2, FIG. 3 is an enlarged view of part C in FIG. 2, and FIG. 4 is a cross-sectional view of FIG. 1 along section B1-B2.

Referring to FIG. 1 to FIG. 4, embodiments of the present disclosure provide a solar cell. Through the configuration of the solar cell, an optical loss as well as an electrical loss of the solar cell is reduced, thereby improving cell performance of the solar cell.

Referring to FIG. 2, the solar cell includes a substrate 100, and the substrate 100 has a first surface 11 and a second surface 12 opposite to each other.

In some embodiments, a material of the substrate 100 includes an elemental semiconductor material. Specifically, the elemental semiconductor material includes a single element, which may be silicon or germanium, for example. The elemental semiconductor material may be in a monocrystalline state, a polycrystalline state, an amorphous state, or a microcrystalline state (i.e., a state having both the monocrystalline state and the amorphous state), e.g., silicon may be at least one of monocrystalline silicon, polycrystalline silicon, amorphous silicon, or microcrystalline silicon.

In some embodiments, the material of the substrate 100 includes a compound semiconductor material. Common compound semiconductor materials include, but are not limited to, silicon germanium, silicon carbide, gallium arsenide, indium gallium, chalcogenide, cadmium telluride, copper indium selenide, and other materials. The substrate 100 includes a sapphire substrate, a silicon-on-insulator (SOI) substrate, or a germanium-on-insulator (GOI) substrate.

In some embodiments, the substrate 100 includes an N-type semiconductor substrate or a P-type semiconductor substrate. The N-type semiconductor substrate is doped with N-type dopant, and the N-type dopant includes any of Group V elements such as phosphorus (P), bismuth (Bi), antimony (Sb), or arsenic (As), and the like. The P-type semiconductor substrate is doped with a P-type dopant, and the P-type dopant includes any of Group III elements such as boron (B), aluminum (Al), gallium (Ga), or indium (In), and the like.

In some embodiments, the first surface 11 of the substrate 100 is a front surface and the second surface 12 is a rear surface, or the first surface 11 of the substrate 100 is the rear surface and the second surface 12 is the front surface, i.e., the solar cell is a single-sided cell, the front surface is used as a light-receiving surface for receiving incident light, and the rear surface is used as a backlighting surface. In some embodiments, the solar cell is a double-sided cell, i.e., the first surface 11 and the second surface 12 of the substrate both serve as light-receiving surfaces for receiving incident light.

In some embodiments, referring to FIG. 2, the solar cell includes an emitter 102, and the emitter 102 is formed on the first surface 11 of the substrate 100.

In some embodiments, a type of the dopant in the emitter 102 is different from a type of the dopant in the substrate 100. A PN junction is formed between the emitter 102 and the substrate 100, and new hole-electron pairs are formed by sun irradiation on the PN junction. Under the action of the built-in electric field in the PN junction, photogenerated holes flow into the P region and photogenerated electrons flow into the N region. The P-type semiconductor has a hole (the P-type semiconductor has one less negatively charged electron, which is regarded as having one more positively charged electron), and the N-type semiconductor has one more free electron, causing a potential difference to generate electricity, so that when the sun is irradiated, the light excites the electrons in the silicon atoms (photoelectric effect) to produce convection of electrons and holes, and these electrons and holes will be affected by the built-in potential and gathered in the N region and P region, respectively. At this time, if the external is connected via electrodes, a loop is formed to generate current.

In some embodiments, the emitter 102 includes a textured structure 120 on a side away from the first surface 11.

In some embodiments, the textured structure 120 includes a regular shaped pyramidal textured structure as well as irregularly shaped black silicon. A beveled surface of the textured structure 120 increases internal reflection of the incident light, thereby increasing absorption and utilization of the incident light by the substrate, and thereby increasing the cell efficiency of the solar cell.

In some embodiments, the textured structure 120 includes at least one protrusion structure 112. The arrangement, heights, and dimensions of a plurality of protrusion structures 112 may be in any range known to those skilled in the art, which are not limited in the embodiments of the present disclosure. The configuration of the protrusion structure 112 as a pyramidal textured structure is only an example.

In some embodiments, the protrusion structure 112 has a dimension in a range of 100 nm to 10 um. The dimension of the protrusion structure 112 is in a range of 100 nm to 300 nm, 300 nm to 600 nm, 600 nm to 1000 nm, 1 um to 2 um, 2 um to 4 um, 4 um to 7 um, or 7 um to 10 um. The protrusion structure 112 has a height in a range of 100 nm to 10 um. The height of the protrusion structure 112 is in a range of 100 nm to 450 nm, 450 nm to 700 nm, 700 nm to 1700 nm, 1.7 um to 3.2 um, 3.2 um to 6.1 um, 6.1 um to 8.5 um, or 8.5 um to 10 um. The dimension of the protrusion structure 112 within the above ranges ensures that defects of the first surface 11 of the substrate 100 are small, and that the beveled surface of the protrusion structure 112 is able to repeatedly reflect the incident light, thereby improving the utilization of light. In addition, the height of the protrusion structure 112 refers to a vertical distance between a highest point of the protrusion structure 112 away from the second surface 12 and the bottom of the protrusion structure 112.

The dimension of the protrusion structure 112 refers to the following: a certain region is arbitrarily designated within a range of the surface of the substrate, one-dimensional dimensions of bottoms of individual protrusion structures 112 within this region are detected and ultimately averaged. It is thus known that the dimension range of the protrusion structure refers to an average range of dimensions of individual protrusion structures 112 within a region, not a full range of the dimensions of all protrusion structures 112 over the substrate, and that the full range of all the dimensions of the protrusion structures 112 is generally greater than the average range. For illustrative purposes, each of the protrusion structures 112 in FIG. 2 has the same shape and dimensions equal to an average one-dimensional dimension.

It should be noted that the one-dimensional dimension refers to a distance between two opposite corners of the bottom of the protrusion structure. In some embodiments, the one-dimensional dimension may also be a distance between two lateral edges of the bottom of the protrusion structure. For example, surfaces of some of the protrusion structures away from the first surface are flush with the bottom surface, and surfaces of some of the protrusion structures away from the first surface are higher than the bottom surface or lower than the bottom surface, which all accord with the textured structure 120 included in the embodiments of the present disclosure.

It should be noted that the first surface of the substrate is also able to be used as the surface of the emitter because the emitter and the substrate are prepared by the same substrate or the emitter is a part of the substrate, i.e., if the emitter has a textured structure, the substrate similarly has a textured structure of the same size as well as shape.

In some embodiments, the protrusion structure 112 includes a pyramid shape, a sinusoidal curve shape, or a parabolic shape.

In some embodiments, referring to FIG. 2, the solar cell includes a passivation structure 104 formed on the textured structure of the emitter 102.

In some embodiments, the passivation structure 104 includes a single film layer structure, and a material of the passivation structure 104 includes any one of silicon oxide, silicon nitride, silicon nitride oxide, silicon carbon nitride oxide, titanium oxide, hafnium oxide, or aluminum oxide, etc.

In some embodiments, the passivation structure 104 includes a stacked film layer structure, such as a first passivation film layer, a second passivation film layer, and a third passivation film layer that are stacked. A material of the stacked film layer structure includes any one or more of silicon oxide, silicon nitride, silicon nitride oxide, silicon carbon nitride oxide, titanium oxide, hafnium oxide, or aluminum oxide, etc.

In some embodiments, referring to FIG. 2, the solar cell includes first electrodes 108 penetrating the passivation structure 104 and in electrical contact with the textured structure 120 of the emitter 102.

In some embodiments, the first electrodes 108 are sintered from a burn-through paste. A method of forming the first electrodes 108 includes printing a metallic paste on a part of the surface of the passivated structure 104 or an antireflection layer using a screen printing process. The metallic paste includes at least one of silver, aluminum, copper, tin, gold, lead, or nickel.

The metallic paste is subjected to a sintering process. In some embodiments, the metallic paste has a material with a highly corrosive component, such as glass, such that the corrosive component corrodes the passivation structure 104 or the antireflection layer during the sintering process, thereby causing the metallic paste to permeate through the passivation structure 104 or the antireflection layer to be in electrical contact with the substrate 100 (emitter 102).

In some embodiments, the first electrode 108 includes a glass layer, and the glass layer is disposed on a side adjacent to the emitter 102. The material of the glass layer includes a glass material that includes at least one of metallic glass particles, tellurium powder-containing glass particles, lead-containing glass particles, or lead-free glass particles. Commonly used glass materials are lead-containing glass materials, for example, Pb—Al—B—SiO2 glass material is one of the commonly used lead-containing glass materials, and other materials such as Pb—Sn-V-O, Pb—B-V-O, etc. are also used. In the lead-free glass materials, there are generally P—Zn—O series, V—Ba—P—O series, B-V-O series, Sn—B—Si—O series, Bi—B—Si—O series, etc.

With reference to FIG. 3, the solar cell further includes eutectic layers 103, each of the eutectic layers 103 is a special film layer formed as a result of the process of sintering the metallic paste, whereby some of metal ions within the metallic paste precipitate and intercalate with the material from which the emitter 102 is constructed.

In some embodiments, the eutectic layer 103 includes conductive particles 116. the conductive particles 116 are used to induce the construction of conductive channels between the emitter 102 and the first electrodes 108 to allow carriers to be transported from the substrate 100 to the first electrodes 108, and thus be collected by an external collection device.

In some embodiments, the conductive particles 116 are agglomerates on a side of the glass layer away from the emitter and extending within the glass layer, or penetrating the glass layer to extend into the emitter, with the agglomerates disposed within the glass layer, and with silver microcrystals disposed between the glass layer and the emitter. During the formation of the first electrodes 108, a part of silver atoms precipitated onto the surface of the emitter synthesize the eutectic layers 103 with the material of the emitter, and another part of the silver atoms are not involved in the synthesizing and is retained in the form of silver microcrystals after complete cooling. That is, the eutectic layers 103 are located not only between the emitter 102 and the first electrodes 108, but also between the glass layer and the emitter 102.

In some embodiments, the conductive particles 116 include silver nanoparticles, silver crystalline particles, or silver agglomerated particles.

It should be understood that when the paste for preparing the first electrodes includes silver, the conductive particles 116 may be silver nanoparticles, silver crystalline particles, or silver agglomerated particles, and similarly, when the paste for preparing the first electrodes includes other metal ions, such as aluminum, copper, or gold, the conductive particles may be aluminum nanoparticles, gold nanoparticles, or copper agglomerated particles.

It should be noted that all of the "particles" in the embodiments of the present disclosure refer to individual agglomerates formed by the agglomeration of at least one crystal structure.

In addition, referring to FIG. 3, due to uncontrollability of the metal ion precipitation, a large number of voids 115 exist between the first electrodes 108 and the emitter 102, and the existence of the voids 115 reduces a contact area between the first electrodes 108 and the surface of the emitter 102, weakening the ability of the first electrodes 108 to collect the current. At the same time, the existence of the voids 115 increases surface defects of the first electrodes 108 and improves a carrier interface recombination rate.

With continued reference to FIG. 2, the solar cell further includes an intrinsic passivation layer 105 formed on the second surface 12 of the substrate 100, a second doped conductive layer 106 formed on the intrinsic passivation layer 105, a transparent conductive layer 107 formed on the second doped conductive layer 106, and second electrodes 109 in electrical contact with the transparent conductive layer 107.

It should be understood that the transparent conductive layer 107 is electrically conductive, and carriers pass through the intrinsic passivation layer 105, the second doped conductive layer 106, and the transparent conductive layer 107 in turn to be eventually collected by the second electrodes 109.

In some embodiments, an interface between the intrinsic passivation layer 105 and the substrate 100, on the one hand, forms a higher open-circuit voltage, and on the other hand, achieves a better passivation effect, thereby improving the conversion efficiency more easily.

In some embodiments, a material of the intrinsic passivation layer 105 includes intrinsic amorphous silicon, silicon oxide, silicon nitride, or silicon carbide. An optional thickness of the intrinsic passivation layer 105 is greater than or equal to 2 micrometers and less than or equal to 10 micrometers, preferably, 5 micrometers.

In some embodiments, the second doped conductive layer 106 includes a composite film layer stacked with one or more of N-type doped or P-type doped amorphous silicon, amorphous silicon oxide, amorphous silicon carbide, microcrystalline silicon, hydrogenated microcrystalline silicon, microcrystalline silicon oxide, microcrystalline silicon carbide, or polycrystalline silicon semiconductor film, and a thickness of the second doped conductive layer 106 is in a range of 4 to 30 nm.

The use of hydrogenated microcrystalline silicon has a larger band gap and a narrower absorption spectral range, so it is able to effectively improve the photoelectric conversion efficiency of the cell. Besides, with increase of a crystallization rate, series resistance is reduced and a filling factor is increased, so it is able to improve an output current of the cell, and effectively prolong the life of the cell.

In some embodiments, the transparent conductive layer 107 includes at least one of indium tin oxide (ITO), aluminum-doped zinc oxide (AZO), cerium-doped indium oxide, and tungsten-doped indium oxide.

In some embodiments, the second surface 12 includes a flat surface, and the flat surface includes a polished surface.

It should be noted that the polished surface refers to a flat surface formed by removing the textured structure of the surface by a polishing solution or laser etching. The flatness of the surface of the substrate 100 increases after polishing, and the reflection of long-wave light increases, so that secondary absorption of projected light is promoted, thus enhancing the short-circuit current. Meanwhile, surface composite of the substrate 100 is reduced and surface passivation effect of the substrate 100 is enhanced due to decrease of the specific surface area of the surface of the substrate 100.

It should be understood that the flat surface refers to a relatively flat surface, rather than an absolutely flat surface, and a surface with a roughness less than or equal to 5 um and greater than or equal to −5 um is generally referred to as the flat surface. In addition, a surface with less roughness than the textured structure 120 may also be referred to as the flat surface.

With continued reference to FIG. 2, the solar cell further includes an antireflection layer 113, and the antireflection layer 113 covers the transparent conductive layer 107, and the second electrodes 109 penetrates the antireflection layer 113 to be in electrical contact with the transparent conductive layer 107.

In some embodiments, the antireflection layer 113 includes a flexible film such as LiF, $MgF_2$, AlN, ZnS, $Si_3N_4$, $SiO_2$, $TiO_2$, or combinations thereof, with a thickness in a range of 0 mm to 3 mm.

In some embodiments, the second electrodes 109 are sintered from a burn-through paste. A method of forming the second electrodes 109 includes printing a metallic paste on a part of the surface of the antireflection layer 113 using a screen printing process. The metallic paste includes at least one of silver, aluminum, copper, tin, gold, lead, or nickel. The metal paste is subjected to a sintering process. In some embodiments, the metallic paste has a material with a highly corrosive component, such as glass, such that the corrosive component corrodes the antireflection layer 113 during the sintering process, thereby causing the metallic paste to permeate through the antireflection layer 113 to be in electrical contact with the transparent conductive layer.

Figure 12:
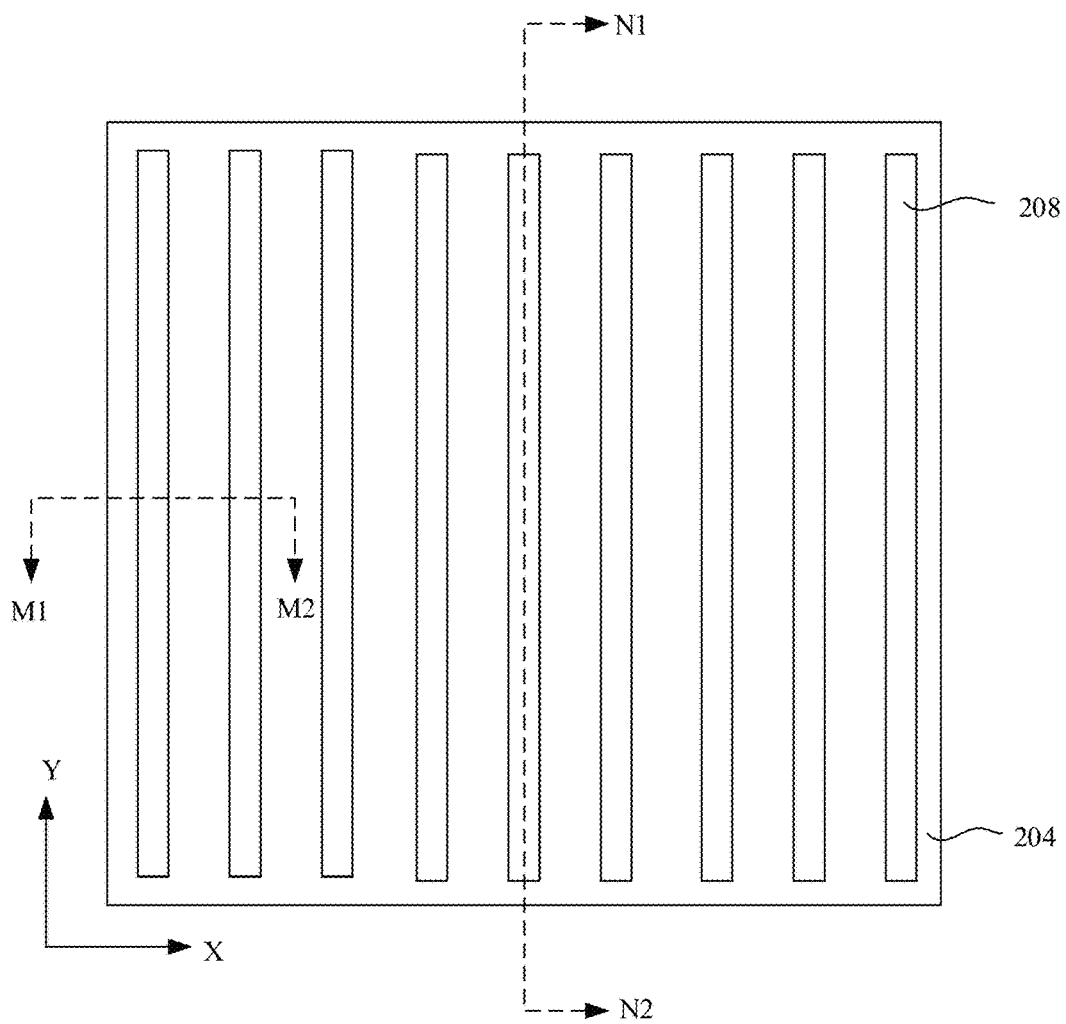
Figure 13:
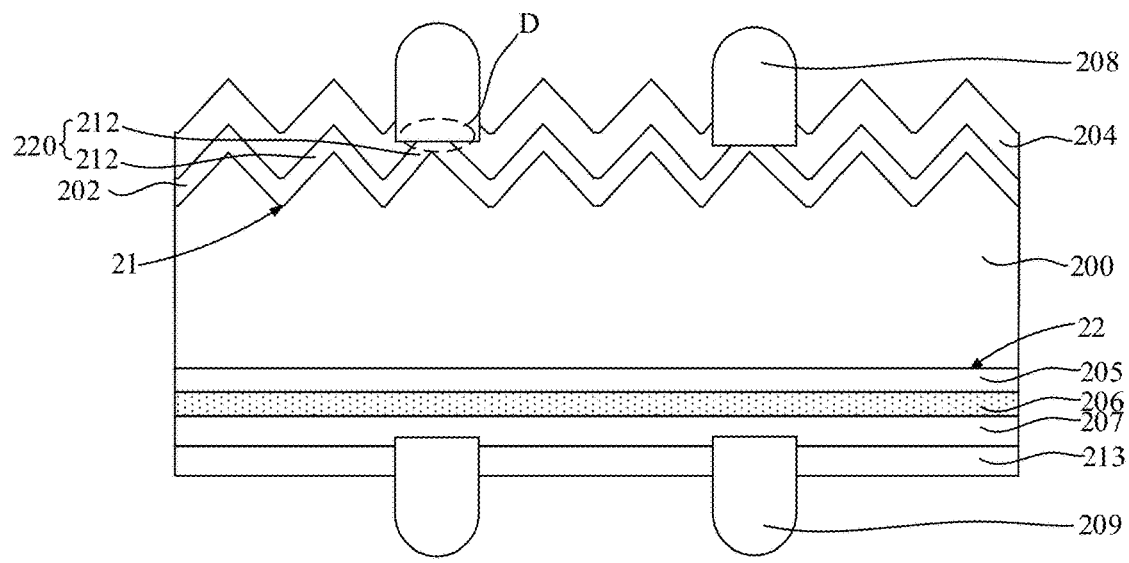
Figure 14:
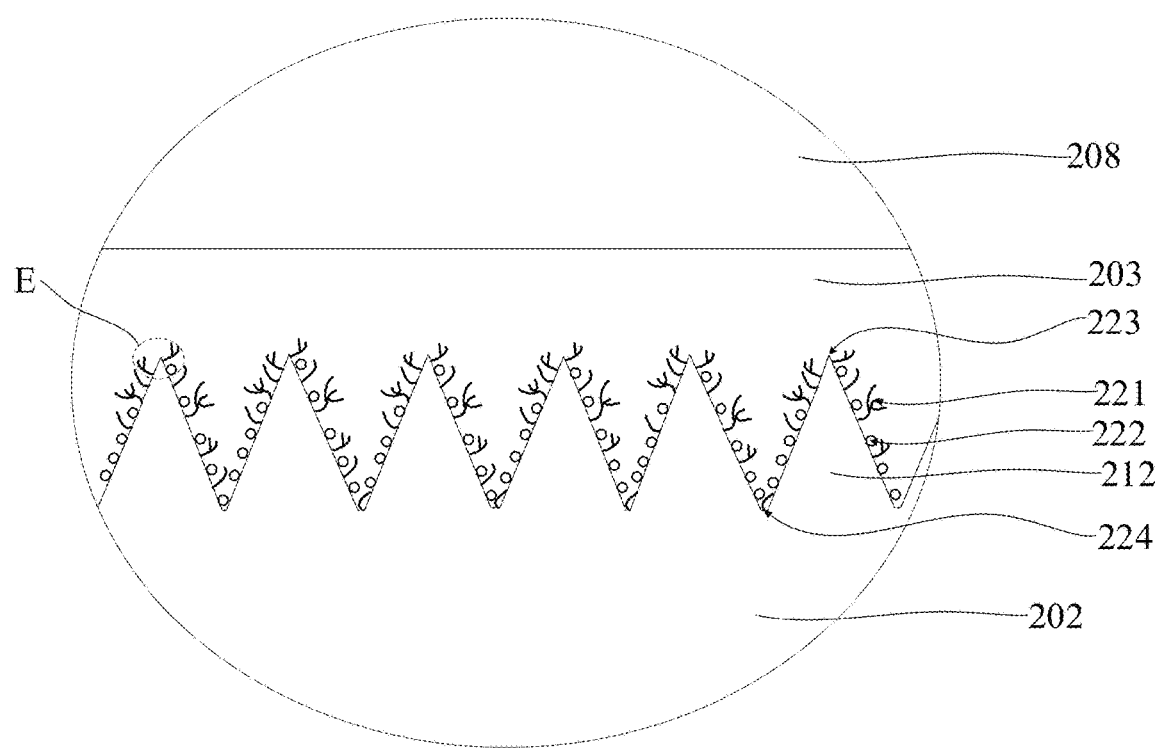
Figure 15:
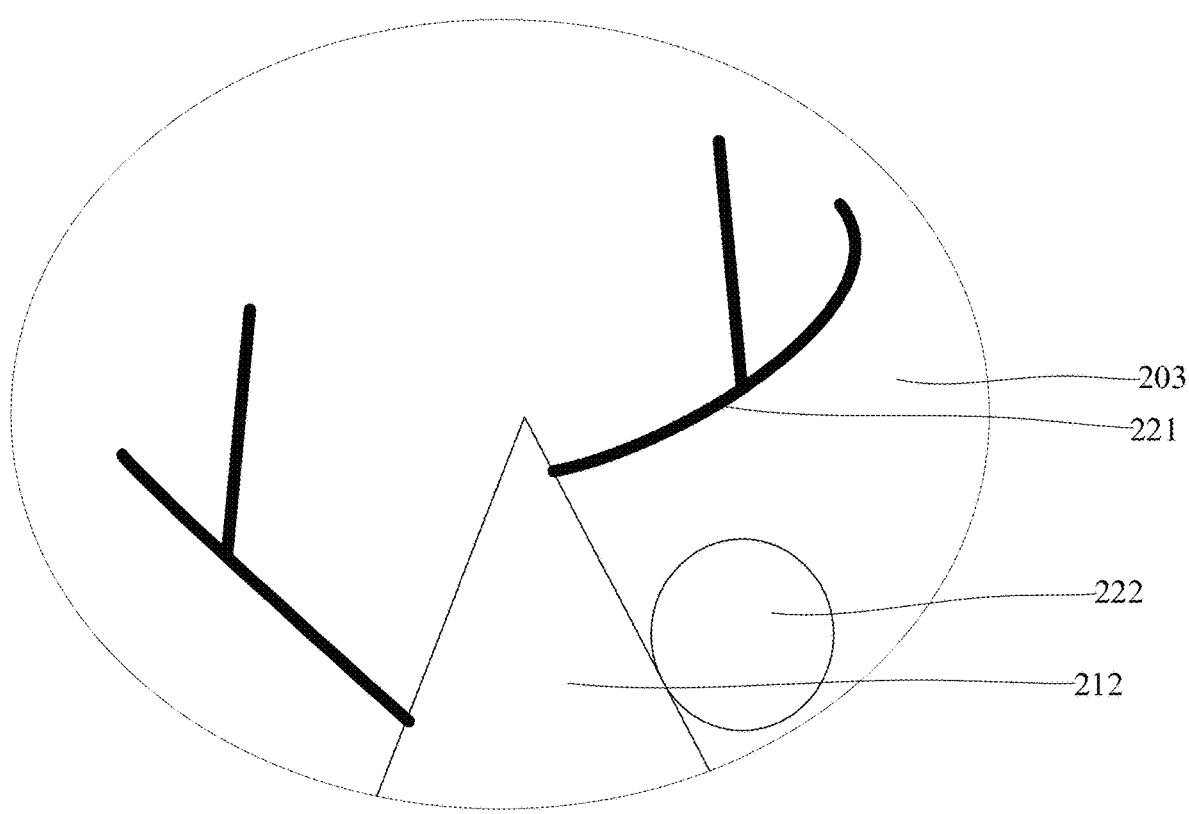
Figure 16:
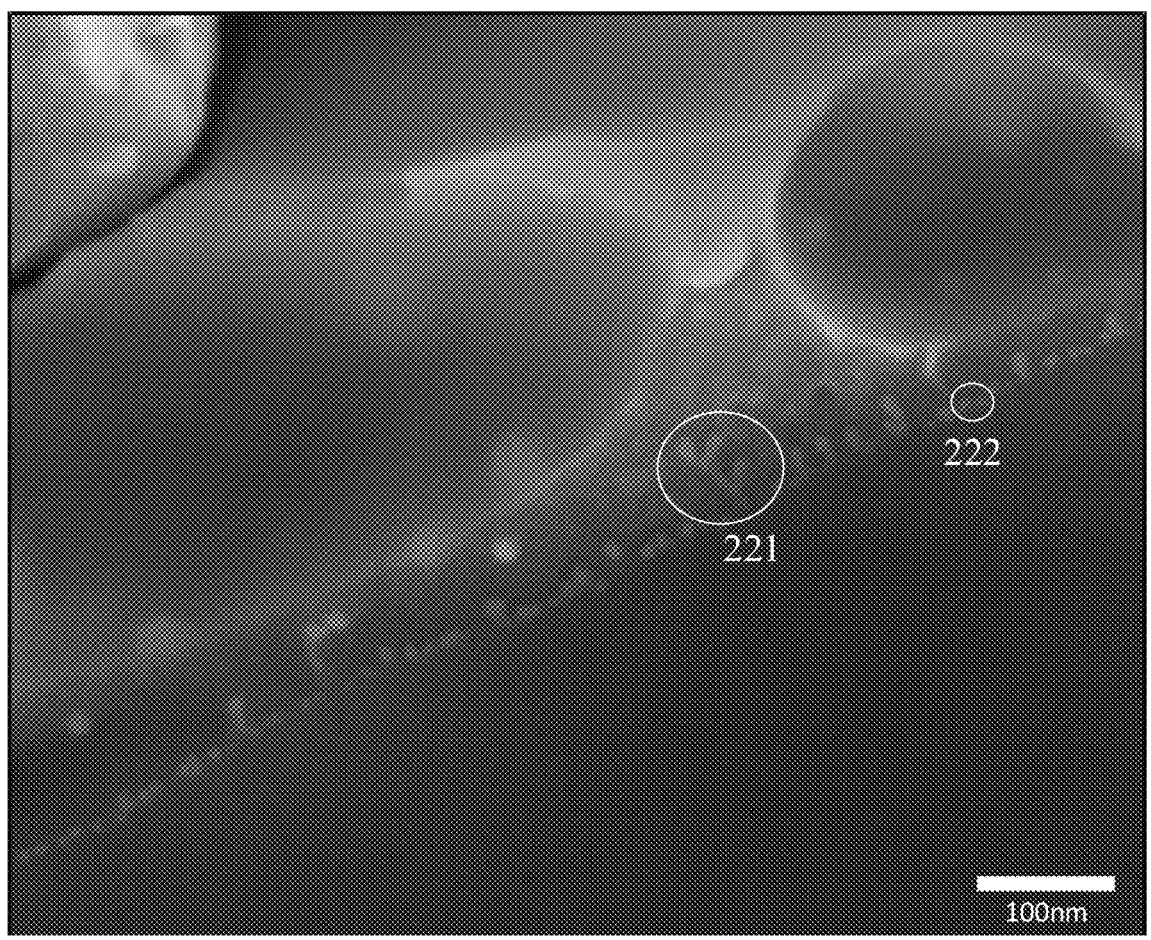
Figure 17:
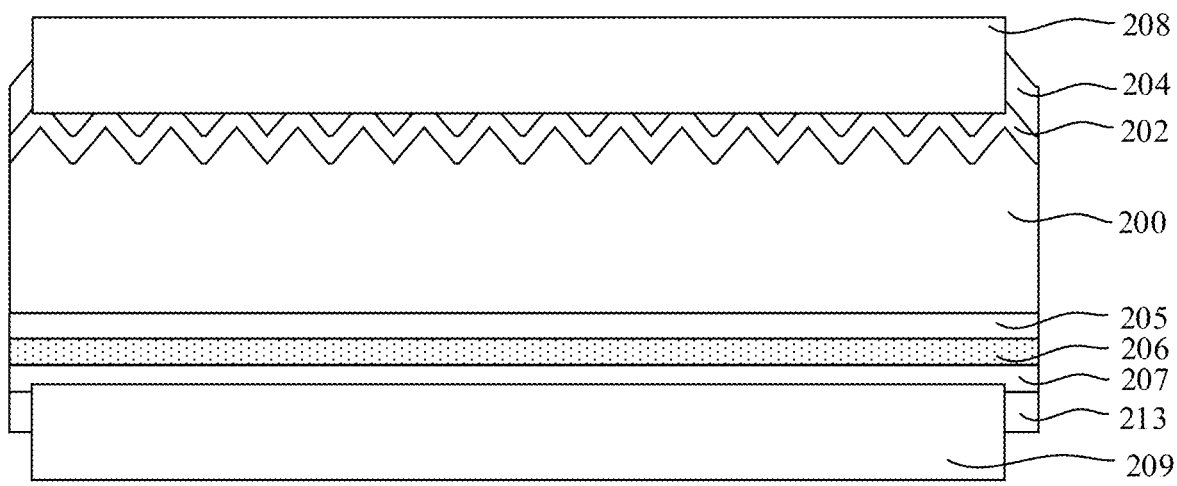

FIG. 5 to FIG. 17 are schematic structural diagrams of solar cells corresponding to various operations of a method for preparing a solar cell according to an embodiment of the present disclosure. An embodiment of the present disclosure provides a method for preparing a solar cell to change a structure of the solar cell and to improve the cell performance of the solar cell. FIG. 13 shows a cross-sectional structural view of FIG. 12 along section M1-M2, FIG. 14 shows an enlarged view of part D in FIG. 13, FIG. 15 shows a partially enlarged view of part E in FIG. 14, FIG. 16 shows an electron microscope image corresponding to FIG. 14, and FIG. 17 shows a cross-sectional structural view of FIG. 12 along section N1-N2.

Figure 5:
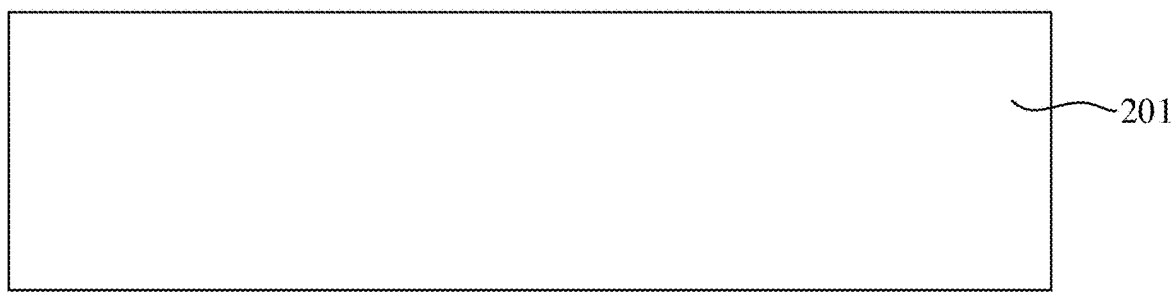
FIG. 5 to FIG. 17 are schematic structural diagrams of solar cells corresponding to various operations of a method for preparing a solar cell according to an embodiment of the present disclosure.

Referring to FIG. 5, the method for preparing the solar cell includes providing a substrate 201.

In some embodiments, the material as well as the effect of the substrate 201 is able to be referred to the material as well as the effect of the substrate described in the previous embodiment, which is not repeated herein.

Figure 6:
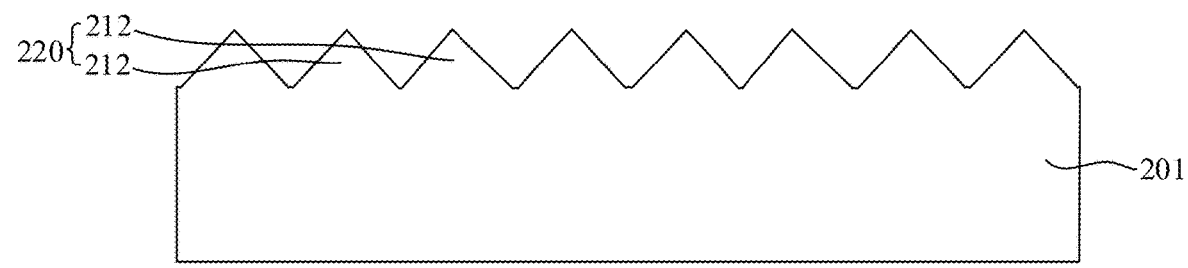

Referring to FIG. 6, the method for preparing the solar cell includes texturing the substrate 201 to form a textured structure 220.

In some embodiments, the textured structure 220 is prepared using solution texturing, and the textured structure 220 increases the number of refractions of light on the surface of the solar cell, which facilitates the absorption of light by the solar cell to achieve maximum utilization of solar energy by the cell. For example, if the substrate 201 is monocrystalline silicon, a mixed solution of an alkali solution and an alcohol solution may be used to carry out the texturing process on the surface of the substrate 201. If the substrate 201 is polycrystalline silicon, an acid solution may be used to carry out the texturing process on the surface of the substrate 201.

In some embodiments, a laser texturing process and a reactive-ion-etching (RIE) texturing process are performed to prepare the textured structure 220.

It should be understood that the texturing process is performed on all surfaces of the substrate, so that the substrate includes textured structures on edges as well as the two opposing surfaces. FIG. 6 shows only one surface having a textured structure.

The textured structure 220 is the same as the textured structure 120 in the above embodiments, reference can be made to the description in the above embodiments, which is not be repeated herein.

Figure 7:
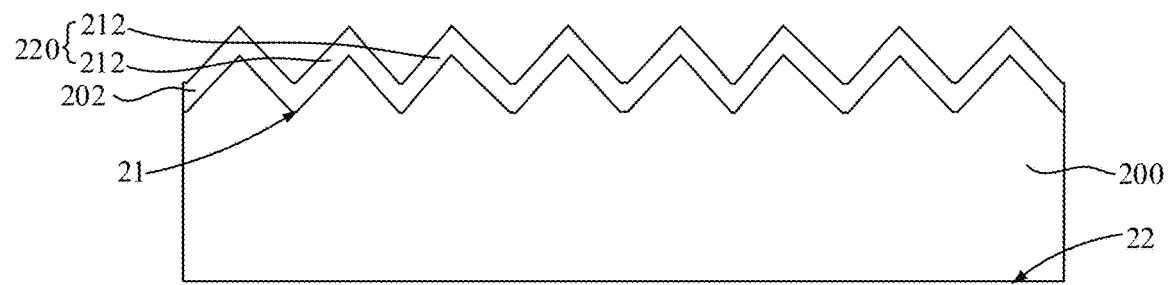

Referring to FIG. 7, the method for preparing the solar cell includes making a junction on one surface of the substrate 201 through diffusion.

In some embodiments, a layer of phosphorosilicate glass PSG or borosilicate glass BSG is deposited on the textured structure 220 of the substrate 201, a diffusion process is performed to enable a portion of the substrate 201 in a thickness direction to serve as an emitter 202 and the remaining portion of the substrate 201 to serve as a substrate 200, and an interface between the emitter 202 and the substrate 200 to serve as a first surface 21 of the substrate. The diffusion process includes a thermal diffusion process or a laser diffusion process.

With continued reference to FIG. 7, the method includes edge etching (de-plating). The etching removes the textured structure at the edges of the substrate 200 as well as on the other side of the substrate 200, i.e., the polishing treatment and the de-plating treatment. The portion of the substrate that is not protected by phosphorosilicate glass or borosilicate glass is etched in a polishing solution to form a polished surface, and the polished surface serves as a second surface 22 of the substrate.

In some embodiments, the substrate 200 is floated on an etching solution including $HF/HNO_3/H_2SO_4$ to remove PSG or BSG from the rear surface and edges while polishing the rear surface, and the acid solution on the surface of the substrate is neutralized by an aqueous NaOH solution. In some embodiments, laser etching is utilized to remove the textured structure.

The method includes removing phosphorosilicate glass or borosilicate glass. PSG or BSG is removed from the first surface of the substrate 200 via an aqueous HF solution.

Figure 8:
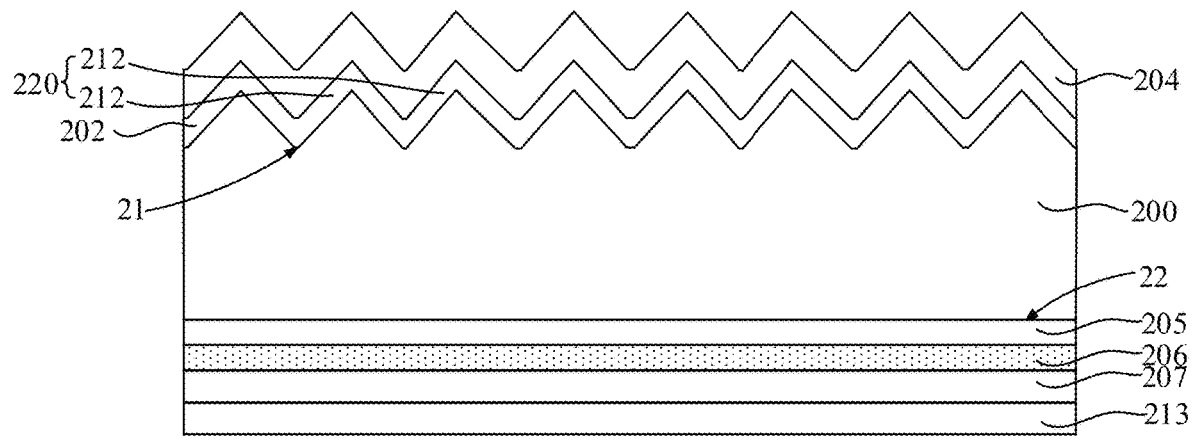

Referring to FIG. 8, the method includes forming a passivation structure 204 on the surface of the emitter 202.

Referring to FIG. 8, the method includes forming an intrinsic passivation layer 205 on the second surface 22 of the substrate 200, forming a second doped conductive layer 206 on the intrinsic passivation layer 205, forming a transparent conductive layer 207 on the second doped conductive layer 206, and forming an antireflection layer 213 on the transparent conductive layer 207.

The materials and effects of the passivation structure 204, the intrinsic passivation layer 205, the second doped conductive layer 206, the transparent conductive layer 207, and the antireflection layer 213 can be referred to the materials and effects of the passivation structure 104, the intrinsic passivation layer 105, the second doped conductive layer 106, the transparent conductive layer 107, and the antireflection layer 113 as described in the above embodiments, which are not repeated herein.

In some embodiments, the passivation structure 204, the intrinsic passivation layer 205, the second doped conductive layer 206, the transparent conductive layer 207, and the antireflection layer 213 are formed using atomic layer deposition or plasma enhanced chemical vapor deposition (PECVD).

Figure 9:
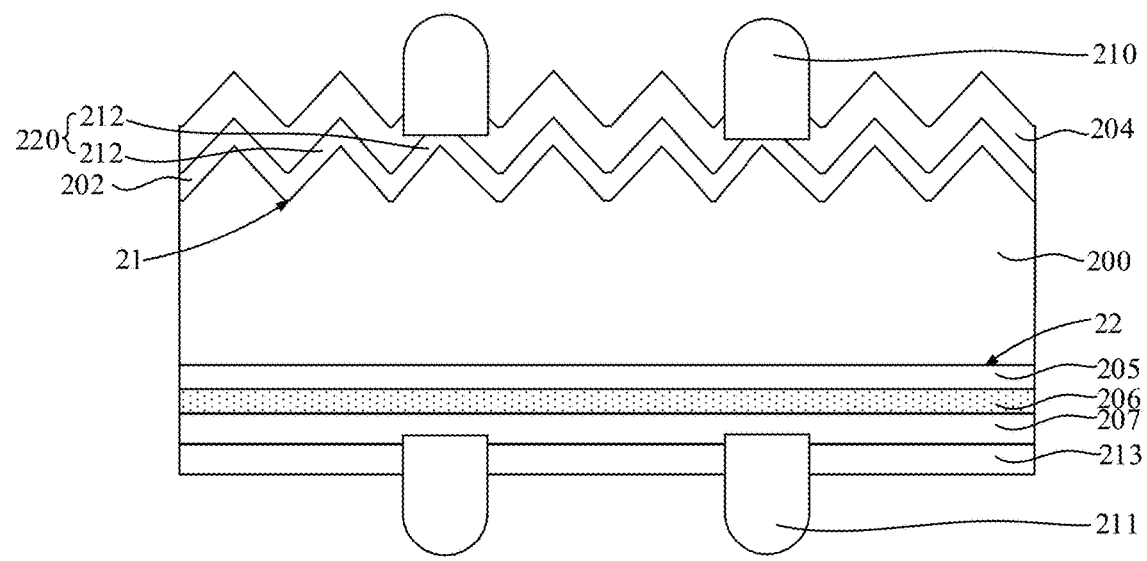

Referring to FIG. 9, a metallic paste is printed by a screen printing process on a top surface of the passivation structure 204 where electrode regions are to be formed.

In some embodiments, the metallic paste has a material with a highly corrosive component, such as glass powder, such that the corrosive component corrodes the passivation structure 204 during the sintering process, thereby causing the metallic paste to penetrate in the passivation structure 204. In some embodiments, a screen printing process is performed to print the metallic paste on the top surface of the passivation structure 204. In some embodiments, the metallic paste includes silver.

With continued reference to FIG. 9, a low-temperature sintering treatment is performed on the metallic paste to cause the metallic paste to penetrate the passivation structure 204 to electrically contact the emitter 202, and the metallic paste is transformed into a plurality of first initial grid lines 210. The low-temperature sintering treatment refers to heat treating the metallic paste using a much lower temperature as compared to a sintering treatment to allow the metallic paste to permeate into a portion of the emitter.

In some embodiments, a peak temperature of the low-temperature sintering treatment is in a range of 200° C. to 750° C., which may be, for example, 200° C. to 250° C., 250° C. to 300° C., 300° C. to 350° C., 350° C. to 390° C., 390° C. to 440° C., 440° C. to 490° C., 490° C. to 530° C., 530° C. to 580° C., 580° C. to 640° C., 640° C. to 660° C., 660° C. to 700° C., or 700° C. to 750° C. In this temperature range, the temperature of the heat treatment is made lower, which prevents the sintering process from causing damage to the passivation structure 204 as well as the substrate. Moreover, the lower sintering temperature makes a sintering depth of the metallic paste in the emitter smaller, which reduces the contact area between the formed first electrodes and the eutectic layers, and ensures a reasonable aspect ratio of the textured structure, so as to improve the internal reflection of the incident light, thereby allowing the solar cell to obtain a higher open-circuit voltage.

Referring to FIG. 9, a plurality of second initial grid lines 211 spaced apart are formed on a surface of the antireflection layer.

It should be noted that the method of forming the second initial grid lines 211 is the same as the method of forming the first initial grid lines 210, i.e., the metallic paste is printed on the surface of the antireflection layer 213, after which the sintering process is performed to sinter the metallic paste to form the second initial grid lines 211, and a specific method may be described with reference to forming the first initial grid lines 210.

Figure 10:
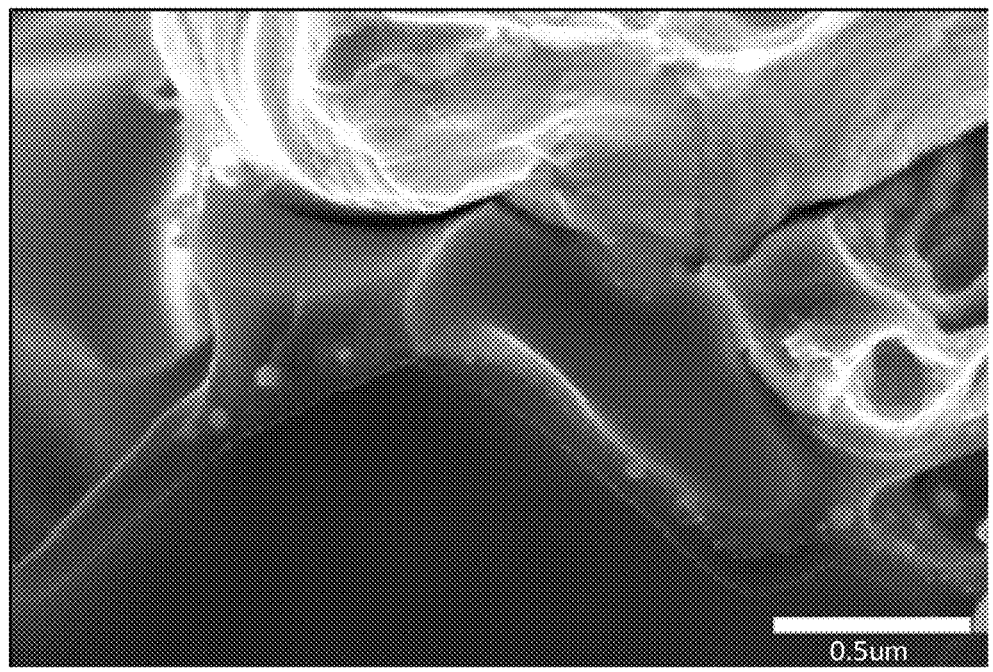

Referring to FIG. 10, FIG. 10 shows an electron microscope image of a first initial grid line 210 and the emitter, initial conductive particles exist between the first initial grid line 210 and the emitter, and the initial conductive particles can be referred to the conductive particles 116 in the above embodiments, which are not repeated herein.

In some embodiments, each of at least some of the initial conductive particles has a size in a range of 10 nm to 20 nm, which may be 10 nm to 13.2 nm, 13.2 nm to 15.3 nm, 15.3 nm to 18.3 nm, or 18.3 nm to 20 nm.

Figure 11:
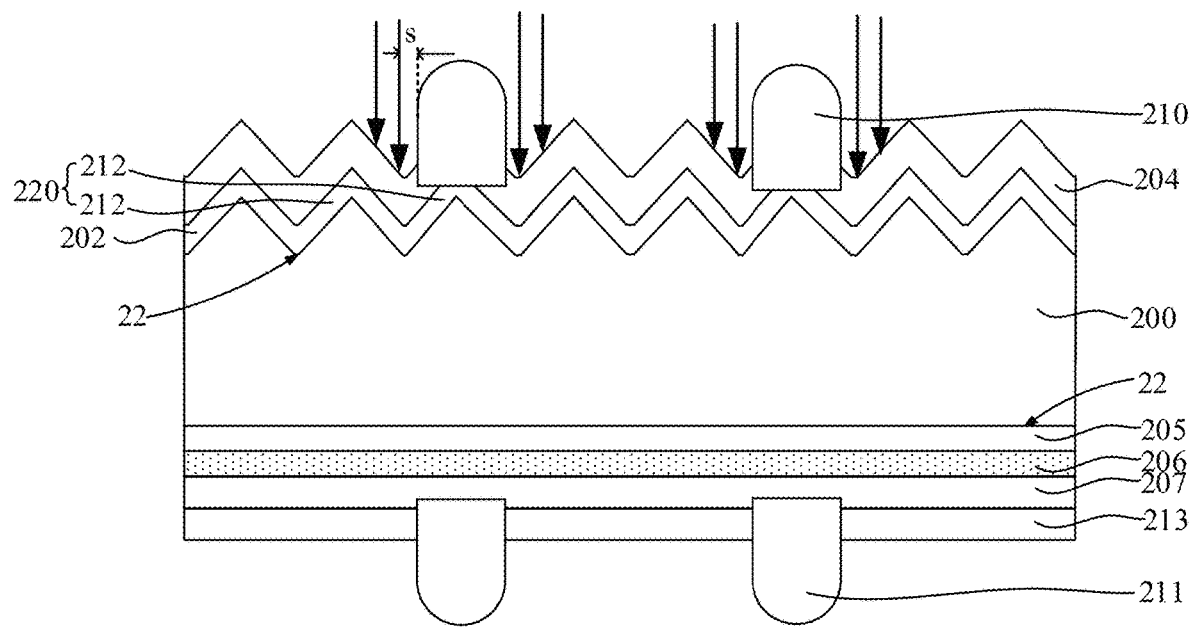

Referring to FIG. 11, in the same operation, an energy injection process is performed for neighboring regions of the first initial grid lines 210, and a reverse current is passed between the first initial grid line 210 and the second initial grid line 211 to reverse bias the PN junction. The neighboring region is defined as a region that is within a preset distance, s, from the edge of the first initial grid line.

In some embodiments, the energy injection process includes a laser process, and the laser process is a laser treatment.

In some embodiments, the energy injection process is performed at a region of the passivation structure 204 not overlapped with regions where the first initial grid lines 210 are formed.

The first initial grid lines 210 and the neighboring regions of the first initial grid lines 210 are lasered, and at the same time, a reverse current is passed between the first initial grid line 210 and the second initial grid line 211 to reverse bias the PN junction. Under laser irradiation, a large number of carriers are generated in the first initial grid lines 210 and the neighboring regions of the first initial grid lines 210, and at the same time, electrons in the carriers are confined in the emitter 202 and on the surfaces of the first initial grid lines 210 due to the reverse bias of the PN junction. The electrons react with the first initial grid lines 210 to induce the precipitation of metal ions in the first initial grid lines 210 to form metal micelles, and the metal micelles form conductive contact sites in the emitter as well as in the passivation structure 204, which reduces the contact resistance and increases the filling factor of the solar cell, thereby improving the photoelectric conversion efficiency of the solar cell.

In some embodiments, the metallic paste includes silver. Silver has good electrical conductivity, silver ions in the first initial grid lines 210 precipitate to form silver micelles, and the silver micelles form conductive contact sites in the passivation structure as well as in the textured structure to reduce the contact resistance, which not only increases the filling factor, but also improves the efficiency of transmission of the carriers to the first initial grid lines 210 and capability of the first initial grid lines 210 for collecting the carriers.

Since the carriers generated by the laser process react with the first initial grid lines 210, laser irradiation is performed on the first initial grid lines 210 and the neighboring regions of the first initial grid lines 210, so that a larger number of carriers are generated in the neighboring regions of the first initial grid lines 210, thereby making a distance of carrier transmission to the first initial grid line 210 shorter, reducing transmission loss, and making most of the carriers generated by the laser process are able to react with the first initial grid lines 210, thus improving reaction efficiency.

In addition, since the laser process is performed only on the first initial grid lines 210 and the neighboring regions of the first initial grid lines 210, an area of the solar cell to be treated by the laser process is smaller, the time of the laser process is shortened, and the efficiency of the treatment is thus improved.

It should be understood that laser light of the laser process is irradiated into the substrate 100 to generate a greater number of carriers in the emitter as well as in the substrate.

In some embodiments, the preset distance s is not greater than 1.5 cm. In some embodiments, the preset distance s is equal to 1.5 cm. In some embodiments, the preset distance s is less than 1.5 cm, which may be, for example, 0.005 cm, 0.01 cm, 0.015 cm, 0.02 cm, 0.05 cm, 0.1 cm, 0.2 cm, 0.4 cm, 0.5 cm, 0.6 cm, 0.8 cm, 1 cm, 1.2 m, 1.3 cm, or 1.5 cm. The preset distance s is set within this range, which makes a width of the neighboring region larger, so that the laser process is performed on the region having a larger area so as to generate a larger number of carriers, so that the larger number of carriers react with the first initial grid lines 210 to precipitate the metal ions, thereby forming of a larger number of contact sites, which is conducive to increasing the filling factor. In addition, within this range, the preset distance s is not too large, which improves the efficiency of the laser process.

In some embodiments, the preset distance s is greater than 1.5 cm. For example, laser irradiation is performed on all regions of the first surface 21 other than the first initial grid lines 210, thereby generating a greater number of carriers to allow a greater number of electrons to react with the first initial grid lines 210, so as to induce the precipitation of the metal ions in the first initial grid lines 210 to form a greater number of contact sites.

In some embodiments, the laser process has a laser power in a range of 1 W to 60 W, which may be, for example, 1 W to 5 W, 5 W to 10 W, 10 W to 15 W, 15 W to 20 W, 20 W to 25 W, 25 W to 30 W, 30 W to 35 W, 35 W to 40 W, 45 W to 50 W, 50 W to 55 W, or 55 W to 60 W. The laser process has a scanning speed in a range of 2000 mm/s to 50,000 mm/s, which may be, for example, 2000 mm/s to 5000 mm/s, 5000 mm/s to 8000 mm/s, 8000 mm/s to 10000 mm/s, 10000 mm/s to 12000 mm/s, 12000 mm/s to 16000 mm/s, 16000 mm/s to 19000 mm/s, 19000 mm/s to 25000 mm/s, 25000 mm/s to 30000 mm/s, 30000 mm/s to 35000 mm/s, 35000 mm/s to 40000 mm/s, 40000 mm/s to 45000 mm/s, or 45000 mm/s to 50000 mm/s. Within this range, the laser energy generated by the laser process is able to reach inside the substrate 200 to generate carriers in the emitter as well as in the substrate 200. Within this range, more carriers are generated to react with the first initial grid lines 210. Moreover, within this range, the laser energy of the laser process is also not too large, which prevents the laser energy from causing thermal damage to the substrate 100 as well as the first initial grid lines 210.

In some embodiments, laser light used for the laser process includes any one of infrared light, green light, ultraviolet light, or ultraviolet-green-infrared light, and a laser used for the laser process includes any one of a $CO_2$ laser, an excimer laser, a titanium gemstone laser, a semiconductor laser, or a high-power short-pulse (fs-ns) laser.

For different lasers, different laser powers, different pulse widths, or different scanning speeds are set to generate a greater number of carriers.

In some embodiments, the laser includes a nanosecond green light laser, and the nanosecond green light laser has a pulse width in a range of 1ns to 200 ns, which may be, for example, 1ns to 10 ns, 10 ns to 20 ns, 20 ns to 35 ns, 35 ns to 40 ns, 40 ns to 60 ns, 60 ns to 80 ns, 80 ns to 110 ns, 110 ns to 150 ns, 150 ns~180 ns or 180 ns~200 ns, a laser power in a range of 1 W to 30 W, which may be, for example, 1 W to 5 W, 5 W to 8 W, 8 W to 12 W, 12 W to 16 W, 16 W to 19 W, 19 W to 22 W, 22 W to 26 W, 26 W to 28 W or 28 W to 30 W, a scanning speed in a range of 2000 mm/s to 50000 mm/s, which may be, for example, 2000 mm/s to 5000 mm/s, 5000 mm/s to 8000 mm/s, 8000 mm/s to 10000 mm/s, 10000 mm/s to 12000 mm/s, 12000 mm/s to 16000 mm/s, 16000 mm/s to 19000 mm/s, 19000 mm/s to 25000 mm/s, 25000 mm/s to 30000 mm/s, 30000 mm/s to 35000 mm/s, 35000 mm/s to 40000 mm/s, 40000 mm/s to 45000 mm/s or 45000 mm/s to 50000 mm/s.

In some embodiments, the method of performing the laser process on the first initial grid lines 210 and the neighboring regions of the first initial grid lines 210 includes using the laser to continuously scan the first initial grid lines 210 and the neighboring regions of the first initial grid lines 210 to form laser processed regions in the first initial grid lines 210 and the neighboring regions of the first initial grid lines 210, and projections of the laser processed regions on a surface of the first passivation layer 120 covering the first initial grid lines 210 and the neighboring regions of the first initial grid lines 210. That is, all of the first initial grid lines 210 and the neighboring regions of the first initial grid lines 210 are the regions to be laser processed, and the laser process treats each of the first initial grid lines 210 and the neighboring regions of the first initial grid lines 210 so that the first initial grid lines 210 and the neighboring regions of the first initial grid lines 210 are all converted into the laser processed regions, so that an area of the laser processed regions is larger, so as to generate more carriers to react with the first initial grid lines 210, thereby precipitating more metal ions to generate more contact sites on the first initial grid lines 210 and the first surface.

In some embodiments, the method of performing the laser process on the first initial grid lines 210 and the neighboring regions of the first initial grid lines 210 includes using the laser to intermittently scan the first initial grid lines 210 and the neighboring regions of the first initial grid lines 210 to form a plurality of laser processed regions in the first initial grid lines 210 and the neighboring regions of the first initial grid lines 210, and the plurality of laser treated regions are spaced apart. That is, the laser process graphically scans the first initial grid lines 210 and the neighboring regions of the first initial grid lines 210 so that a part of the first initial grid lines 210 and a part of the neighboring regions of the first initial grid lines 210 are processed by the laser process to form the laser processed regions. The remaining part of the first initial grid lines 210 and the remaining part of the neighboring regions of the first initial grid lines 210 are not processed by the laser process, so that the area of the formed laser processed regions is smaller. In this way, the area of the laser processed regions is able to be regulated by the scanning manner of the laser process, and thus the number of generated carriers is able to be regulated so that the number of carriers meets the demand.

Since the first initial grid lines 210 are in electrical contact with the emitter, and the emitter forms a PN junction with the substrate 200, the electrons in the carriers are confined when the PN junction is reverse biased, and the confined electrons react with the first initial grid lines 210. In some embodiments, the laser process is performed on the first initial grid lines 210 as well as the neighboring regions of the first initial grid lines 210 so that the generated carriers are closer to the PN junction or the generated carriers are located in the emitter forming the PN junction, which allows the PN junction to confine a larger number of carriers after being reverse biased, thereby causing a larger number of carriers to react with the first initial grid lines 210.

In some embodiments, the laser process is provided to simultaneously laser the first initial grid lines 210, the neighboring regions of the first initial grid lines 210, the second initial grid lines 211, and the neighboring regions of the second initial grid lines 211.

Referring to FIG. 11, in some embodiments, the laser used for the laser process includes a movable laser, the laser is located above the first initial grid line 210, and laser scanning of the first initial grid lines 210 and the neighboring regions of the first initial grid lines 210 is realized by the movable laser when the laser light is emitted from the movable laser.

Reverse current means that the current passed between the first initial grid line 210 and the second initial grid line 211 causes the current flowing in the PN junction to flow from the N region to the P region, which causes the PN junction to be reverse biased, i.e., the built-in electric field in the PN junction is in the same direction as the applied electric field, and the PN junction does not conduct. In this way, the electrons in the carriers are confined in the emitter 202.

In some embodiments, the reverse current has a magnitude in a range of 1 A to 40 A, which may be, for example, 1 A to 5 A, 5 A to 10 A, 10 A to 15 A, 15 A to 20 A, 20 A to 25 A, 25 A to 30 A, 30 A to 35 A, or 35 A to 40 A. Within this range, the PN junction is ensured to be reverse biased and a larger number of carriers are confined to the emitter 202 and surfaces of the first initial grid lines 210, causing the electrons in the carriers to react with the first initial grid lines 210, and inducing the precipitation of metal ions in the first initial grid lines 210.

In some embodiments, the method of passing the reverse current between the first initial grid line 210 and the second initial grid line 211 includes providing a power supply, with a negative terminal of the power supply electrically connected to one of the first initial grid line 210 or the second initial grid line 211, and a positive terminal of the power supply electrically connected to the other of the first initial grid line 210 or the second initial grid line 211, so as to apply a reverse bias voltage between the first initial grid line 210 and the second initial grid line 211. Since the first initial grid line 210 and the second initial grid line 211 are located on two opposite surfaces of the substrate 200, a loop is formed between the substrate 200 and the emitter 202 when the reverse bias voltage is applied between the first initial grid line 210 and the second initial grid line 211. The first initial grid line 210 or the second initial grid line 211 electrically connected to the negative terminal of the power supply is electrically connected to the N region in the PN junction, and the first initial grid line 210 or the second initial grid line 211 electrically connected to the positive terminal of the power supply is electrically connected to the P region in the PN junction such that a voltage of the N region in the PN junction is higher than a voltage of the P region, and the current flows from the N region to the P region such that the PN junction does not conduct.

In some embodiments, referring to FIG. 12 to FIG. 17, in an operation of the energy injection process, some of the initial conductive particles are transformed into first conductive particles 221 and some of the initial conductive particles are transformed into second conductive particles 222. A size of a second conductive particle 222 is larger than a size of the initial conductive particle. A portion of a first initial grid line 210 having the first conductive particles 221 as well as the second conductive particles 222 serves as the conductive eutectic layer 203, and the remaining portion of the first initial grid line 210 serves as the first electrode 208.

In some embodiments, the first conductive particle 221 has a different shape from the second conductive particle 222. The first conductive particle 221 has a branched shape or a linear shape, and the first electrodes 208 achieve ohmic contact with the emitter 202 through the conductive eutectic layers 203. The conductive eutectic layer 203 includes the first conductive particles 221 and the second conductive particles 222, and the first conductive particles 221 include a linear shape and a branched shape. Compared to the agglomerate shape, the linear shape and the branched shape have larger specific surface areas, inducing a larger contact area between the first conductive particles 221 and the emitter 202, reducing the contact resistances between the conductive eutectic layers 203 and the emitter 202, and reducing the electrical losses of the solar cell, thereby increasing the cell efficiency.

The branched shape includes, as shown in FIG. 15, a star shape, a branch shape, a comb shape, or any non-linear shape with branching.

In some embodiments, a total number of the first conductive particles 221 and the second conductive particles 222 is a first number, a number of the first conductive particles 221 is a second number, and a ratio of the second number to the first number is in a range of 20% to 80%. In this way, the contact resistances between the conductive eutectic layers and the emitter is lowered by a large amount, and the open-circuit voltage of the solar cell is increased. Besides, the first conductive particles 221 may be coated by the material of the glass layer and fixed to the surface of the emitter 202 away from the first surface 21. The number of the first conductive particles 221 also reflects the energy as well as the length of time for preparing the first conductive particles 221, i.e., to ensure that a certain number of the first conductive particles 221 are used to reduce the contact resistance, and at the same time to prevent ions constructing the first conductive particles 221 from corroding the textured structure 220 excessively, resulting in the failure of the textured structure 220, thus increasing the optical loss.

Moreover, the textured structure 220 is provided on the side of the emitter 202 away from the first surface 21, and the first conductive particles 221 and the second conductive particles 222 are also located on the textured structure 220. Compared to a flat surface, the contact area between the textured structure 220 and the first conductive particles 221 is increased, and the textured structure 220 also increases the distance between the first conductive particles 221 and the second conductive particles 222 as well as the substrate 200, that is, the distance between the first conductive particles 221 and the PN junction is increased, thereby avoiding reducing the cell efficiency caused by the first conductive particles 221 penetrating the PN junction.

In some embodiments, the ratio of the second number to the first number is in a range of 30% to 70%, which may be, for example, 30% to 43%, 43% to 56%, 56% to 62%, 62% to 70%, or 46% to 64%. With the ratio of the second number to the second number within any of the above ranges, the contact resistances between the conductive eutectic layers 203 and the emitter 202 are low, and the solar cell has good electrical performance. In addition, an area of the beveled surface of the textured structure 220 that is not corroded as well as obscured by the first conductive particles 221 and the second conductive particles 222 is larger, thereby improving the internal reflection of the solar cell and reducing the optical loss.

In some embodiments, referring to FIG. 14, each protrusion structure 212 includes a top portion 223 as well as a bottom portion 224, and the first conductive particles 221 are located at the top portion 223 as well as at the bottom portion 224. The number of the first conductive particles 221 located at the top portion 223 is larger than the number of the first conductive particles 221 located at the bottom portion 224 per unit area. As the laser energy is affected by the distance, the initial conductive particles at the top portion 223 away from the substrate 200 receive more energy, and thus more initial conductive particles are transformed into the first conductive particles 221 under the influence of the laser and current, while the initial conductive particles near the bottom portion 224 are affected by the PN junction because they are closer to the PN junction such that fewer initial conductive particles are transformed into first conductive particles 221 under the influence of the PN junction.

In addition, the first conductive particles 221 require more space to form the linear shape or the branched shape because they have greater specific surface area. The top portion 223 has more space compared to the bottom portion 224, so that the initial conductive particles located at the top portion 223 are more inclined to be transformed into the first conductive particles 221 to increase the contact area between the first electrodes 208 and the emitter 202. The initial conductive particles located at the bottom portion 224 tend to agglomerate together to form a larger aggregate due to space limit, so as to contact with the surfaces of a plurality of protrusion structures 212 to increase the contact area.

In some embodiments, the material of the first conductive particles 221 is the same as the material of the second conductive particles 222. It should be understood that the first conductive particle 221 and the second conductive particle 222 are formed from the same kind of initial particles while growing freely in two different shapes, and they are, essentially, still the same kind of conductive particles.

In some embodiments, the second conductive particles 222 include agglomerates, and a size of an agglomerate is in a range of 12 nm to 120 um, which may be, for example, 12 nm to 35 nm, 35 nm to 48 nm, 48 nm to 66 nm, 66 nm to 79 nm, 79 nm to 83 nm, 83 nm to 98 nm, 98 nm to 114 nm and 114 nm to 120 nm. With the size of the second conductive particle 222 or agglomerate in any of the above ranges, compared to the initial conductive particles, more conductive particles are agglomerated together to improve better conductivity and to build a better conductive network so that the contact resistances between the first electrodes 208 and the emitter 202 are reduced. The size of the second conductive particles is larger, so that the second conductive particles and the first conductive particles are sufficiently disposed on the textured structure, i.e., the surface of the textured structure is sufficiently covered with the second conductive particles as well as the first conductive particles and has a smaller region not covered with the first conductive particles as well as the second conductive particles (the glass layer), so as to increase the conductive performance. In addition, the size of the second conductive particle is larger, and the adhesion between the second conductive particles and the emitter is better, thereby avoiding poor weld tensile performance between welding tapes and the cell caused by the first electrodes detaching from the surface of the cell.

In some embodiments, the first conductive particles 221 include silver nanoparticles or silver crystalline particles.

It should be understood that when the paste for preparing the first electrodes includes silver, the first conductive particles 221 include silver nanoparticles or silver crystalline particles, and similarly, when the paste for preparing the first electrodes includes other metal ions, such as aluminum, copper, or gold, the conductive particles include aluminum nanoparticles or gold nanoparticles.

In some embodiments, the size of the first conductive particle 221 is in a range of 40 nm to 150 nm, which may be, for example, 40 nm to 52 nm, 52 nm to 63 nm, 63 nm to 78 nm, 78 nm to 91 nm, 91 nm to 109 nm, 109 nm to 113 nm, 113 nm to 134 nm, and 134 nm to 150 nm. Within the above ranges, the size of the first conductive particle 221 is not large, so that the number of the first conductive particles 221 and the second conductive particles 222 within the conductive eutectic layers 203 is larger, thus having a larger density. The size of the first conductive particle 221 also ensures that good ohmic contacts are formed between the first conductive particles 221 and the first electrodes 208 as well as the emitter 202, thereby avoiding constructing a small range of conductive network, which affects the contact resistance.

Embodiments of the present disclosure further provide a solar cell prepared by the method for preparing the solar cell in the above embodiments, with the same or corresponding technical features as the above embodiments, which are not repeated herein.

Referring to FIG. 12 to FIG. 17, the solar cell includes a substrate 200 having a first surface 21 and a second surface 22 opposite to each other.

The solar cell includes an emitter 202 formed on the first surface 21 of the substrate 200, the emitter 202 including a textured structure 220 on a side away from the first surface 21, and a passivation structure 204 formed on the textured structure 220.

The solar cell includes first electrodes 208 penetrating the passivation structure 204 and in electrical contact with the textured structure 220 of the emitter 202.

The solar cell includes conductive eutectic layers 203 each formed between a respective first electrode 208 and the emitter 202 and including first conductive particles 221 and second conductive particles 222. Each of the first conductive particles 221 has a shape different from a shape of any of the second electrically conductive particles 222, and the first conductive particle 221 has a branched shape or a linear shape. A total number of the first conductive particles 221 and the second conductive particles 222 is a first number, a number of the first conductive particles 221 is a second number, and a ratio of the second number to the first number is in a range of 20% to 80%.

In some embodiments, the ratio of the second number to the first number is in a range of 30% to 70%.

In some embodiments, the textured structure 220 includes at least one protrusion structure 212 having a dimension in a range of 100 nm to 10 um.

In some embodiments, the protrusion structure 212 includes a pyramid shape, a sinusoidal curve shape, or a parabolic shape.

In some embodiments, each protrusion structure 212 includes a top portion 223 a bottom portion 224, the first conductive particles 221 are located at the top portion 223 and the bottom portion 224, and a number of the first conductive particles 221 located at the top portion 223 is greater than a number of the first conductive particles 221 located at the bottom portion 224 per unit area.

In some embodiments, the first conductive particles 221 have a same material as the second conductive particles 222.

In some embodiments, the second conductive particles 222 include agglomerates, and each of at least some of the agglomerates has a size in a range of 12 nm to 120 nm.

In some embodiments, the first conductive particles 221 include silver nanoparticles or silver crystalline particles.

In some embodiments, each of at least some of the first conductive particles 221 has a size in a range of 40 nm to 150 nm.

In some embodiments, the solar cell further includes: an intrinsic passivation layer 205 formed on the second surface 22, a second doped conductive layer 206 formed on the intrinsic passivation layer 205, a transparent conductive layer 207 formed on the second doped conductive layer 206, and second electrodes 209 in electrical contact with the transparent conductive layer 207.

In the solar cell provided in the embodiments of the present disclosure, ohmic contact is achieved between the first electrodes 208 and the emitter 202 by means of the conductive eutectic layers 203, and the conductive eutectic layers 203 include the first conductive particles 221 and the second conductive particles 222. The first conductive particles 221 present the linear shape as well as the branched shape, compared with the agglomerate shape, the linear shape and the branched shape have a larger specific surface area, thereby reducing contact resistances between the conductive eutectic layers 203 and the emitter 202, reducing the electrical losses of the solar cell, and improving the cell efficiency.

In addition, the total number of the first conductive particles 221 and the second conductive particles 222 is the first number, the number of the first conductive particles 221 is the second number, and the ratio of the second number to the first number ranges from 20% to 80%, so that the contact resistances between the conductive eutectic layers 203 and the emitter 202 is lowered by a larger amount, and the open-circuit voltage of the solar cell is improved. Besides, the first conductive particles 221 may be coated by the material of the glass layer and fixed to the surface of the emitter 202 away from the first surface. The number of the first conductive particles 221 also reflects the energy as well as the length of time for preparing the first conductive particles 221, i.e., to ensure that a certain amount of the first conductive particles 221 are used to reduce the contact resistance, and at the same time to prevent ions constructing the first conductive particles 221 from corroding the textured structure excessively, resulting in the failure of the textured structure, thereby increasing the optical loss.

Moreover, the textured structure is provided on the side of the emitter 202 away from the first surface, and the first conductive particles 221 and the second conductive particles 222 are also disposed on the textured structure. Compared to a flat surface, the contact area between the textured structure 220 and the first conductive particles 221 is increased, and the textured structure 220 also increases the distance between the first conductive particles 221 and the second conductive particles 222 as well as the substrate 200, i.e., the distance between the first conductive particles 221 and the PN junction, thereby avoiding reducing the cell efficiency caused by the first conductive particles 221 penetrating the PN junction.

Figure 18:
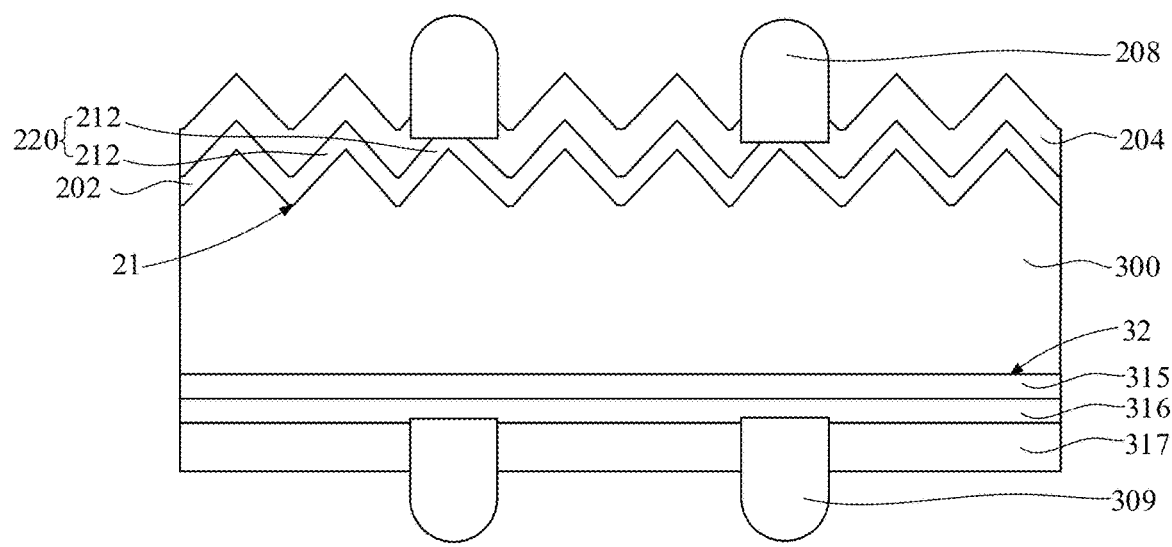
FIG. 18 is another cross-sectional view of a solar cell according to an embodiment of the present disclosure.
Figure 19:
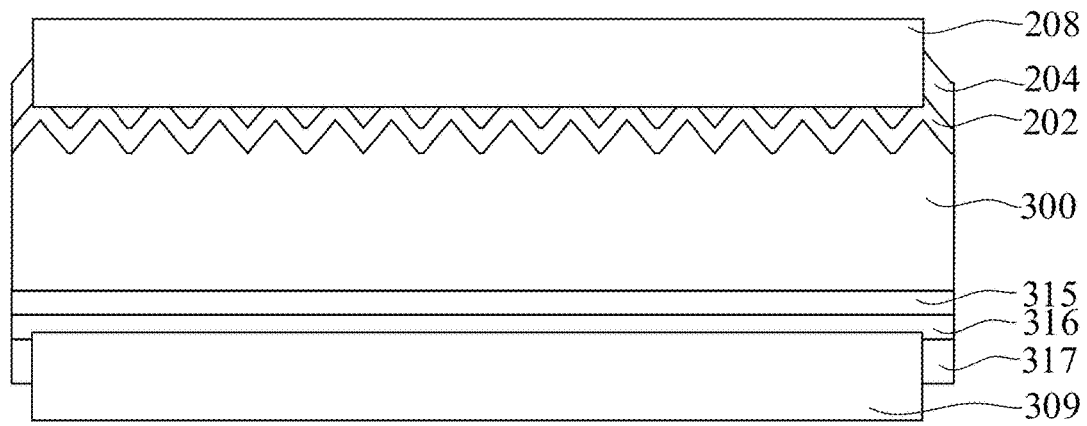
FIG. 19 is still another cross-sectional view of a solar cell according to an embodiment of the present disclosure.

FIG. 18 is another cross-sectional view of the solar cell provided in an embodiment of the present disclosure, and FIG. 19 is yet another cross-sectional view of the solar cell provided in an embodiment of the present disclosure.

Some embodiments of the present application further provide a solar cell, which is basically the same as the solar cell in the above embodiments. The difference is that, with reference to FIG. 18 to FIG. 19, the solar cell includes a tunnelling dielectric layer 315 formed on a second surface 32, a first doped conductive layer 316 formed on the tunnelling dielectric layer 315, a first passivation layer 317 formed on the first doped conductive layer 316, and second electrodes 309 penetrating the first passivation layer 317 and in electrical contact with the first doped conductive layer 316.

In some embodiments, the tunneling dielectric layer 315 and the first doped conductive layer 316 form a passivation contact structure. The first doped conductive layer 316 is able to form band-bending on the surface of the substrate 300, and the tunneling dielectric layer 315 causes asymmetric shifting of the band on the surface of the substrate 300, such that the potential barrier for majority carriers is lower than the potential barrier for minority carriers, and thus the majority carriers are able to pass through the tunneling dielectric layer 315 more easily for quantum tunneling, while the minority carriers have difficulty in passing through the tunneling dielectric layer 315 for selective transport of carriers.

In addition, the tunneling dielectric layer 315 provides a chemical passivation effect. Specifically, due to the presence of interface state defects at an interface between the substrate 300 and the tunneling dielectric layer 315, interface state density on the rear surface of the substrate 300 is larger. The increase in the interface state density promotes recombination of photogenerated carriers, and increases the filling factor, the short-circuit current, and the open-circuit voltage of the solar cell, so as to improve the photoelectric conversion efficiency of the solar cell. The tunneling dielectric layer 315 is provided on the first surface 21 of the substrate 300, so that the tunneling dielectric layer 315 has a chemical passivation effect on the surface of the substrate 300, i.e., reducing defect state density and recombination center of the substrate 300 by saturating dangling bonds of the substrate 300, so as to reduce a carrier recombination rate.

In some embodiments, a material of the tunneling dielectric layer 315 includes at least one of silicon oxide, silicon nitride, silicon nitride oxide, silicon carbide, or magnesium fluoride.

The first doped conductive layer 316 provides a field passivation effect. Specifically, an electrostatic field directed to the interior of the substrate 300 is formed on the surface of the substrate 300, which causes the minority carriers to escape from the interface, so as to reduce the concentration of the minority carriers, reduce the carrier recombination rate at the interface of the substrate 300, and increase the open-circuit voltage, the short-circuit current, and the filling factor of the solar cell, thereby improving the photoelectric conversion efficiency of the solar cell.

A material of the first doped conductive layer 316 includes at least one of amorphous silicon, polysilicon, or silicon carbide.

The first doped conductive layer 316 is doped with the same type of dopant as the substrate 300, for example, if the substrate 300 is doped with a P-type dopant, the type of the dopant in the first doped conductive layer 316 may also be P-type, and if the substrate 300 is doped with a N-type dopant, the type of the dopant in the first doped conductive layer 316 may also be N-type.

The concentration of the dopant in the first doped conductive layer 316 is greater than the concentration of the dopant in the substrate 300 to form a sufficiently high potential barrier on the rear surface of the substrate 300, so as to allow the majority carriers in the substrate 300 to pass through the tunnelling dielectric layer 315 into the first doped conductive layer 316.

In some embodiments, a thickness of the tunneling dielectric layer 315 is in a range of 0.5 nm to 5 nm, and optionally, the thickness of the tunneling dielectric layer 315 is in a range of 0.5 nm to 1.3 nm, 1.3 nm to 2.6 nm, 2.6 nm to 4.1 nm, or 4.1 nm to 5 nm. Within any of the above ranges, the thickness of the tunneling dielectric layer 315 is thinner, and majority carriers are more easily to pass through the tunneling dielectric layer 315 for quantum tunneling, while the minority carriers have difficulty in passing through the tunneling dielectric layer 315 for selective transport of carriers.

In some embodiments, the first passivation layer 317 includes a single film layer structure, and a material of the first passivation layer 317 includes any one of silicon oxide, silicon nitride, silicon nitride oxide, silicon carbon nitride oxide, titanium oxide, hafnium oxide, or aluminum oxide, etc.

In some embodiments, the first passivation layer 317 includes a stacked film layer structure, such as a first passivation film layer, a second passivation film layer, and a third passivation film layer that are stacked. A material of the stacked film layer structure includes any one or more of silicon oxide, silicon nitride, silicon nitride oxide, silicon carbon nitride oxide, titanium oxide, hafnium oxide, or aluminum oxide, etc.

Figure 20:
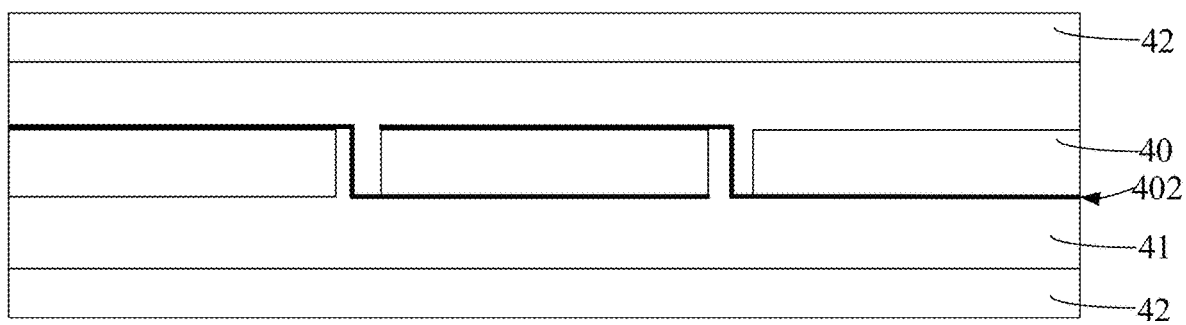
FIG. 20 is a schematic structural diagram of a photovoltaic module according to an embodiment of the present disclosure.

FIG. 20 is a cross-sectional schematic structural diagram of a photovoltaic module provided in an embodiment of the present disclosure.

Some embodiments of the present disclosure further provide a photovoltaic module, referring to FIG. 20, the photovoltaic module including cell strings each formed by connecting a plurality of solar cells 40 according to any one of the above embodiments, encapsulating adhesive films 41 each configured to cover a surface of a respective cell string, and cover plates 42 each configured to cover a surface of a respective encapsulating adhesive film 41 facing away from the respective cell string.

Specifically, in some embodiments, the plurality of cell strings may be electrically connected to each other by conductive tapes 402. FIG. 20 shows only one type of positional relationship between solar cells, whereby electrodes on the cells having the same polarity are disposed in the same direction, in other words, electrodes having a positive polarity on each cell are disposed towards the same side, such that the conductive tapes are connected to different sides of two adjacent cells, respectively. In some embodiments, the cells having electrodes with different polarities are disposed towards the same side, i.e., electrodes of the plurality of adjacent cells having a first polarity, a second polarity, and a third polarity, respectively are arranged in sequence, such that the conductive tape connects two adjacent cell cells on the same side.

In some embodiments, the cells are not spaced apart, i.e., the cells are overlapped with each other.

In some embodiments, the encapsulating adhesive films 41 include a first encapsulation layer and a second encapsulation layer, the first encapsulation layer covers one of the front surface or the rear surface of the solar cell 40, and the second encapsulation layer covers the other of the front surface or the rear surface of the solar cell 40. Specifically, at least one of the first encapsulation layer and the second encapsulation layer includes an organic encapsulation adhesive film such as a polyvinyl butyral (PVB) adhesive film, an ethylene-vinyl acetate (EVA) adhesive film, polyethylene octene co-elastomer (POE) adhesive film, or a polyethylene terephthalate (PET) adhesive film.

It should be understood that the first encapsulation layer and the second encapsulation layer have a demarcation line before lamination, and form the photovoltaic module without the concept of the first encapsulation layer and the second encapsulation layer after the lamination process, i.e., the first encapsulation layer and the second encapsulation layer have already formed the overall encapsulation adhesive film 41.

In some embodiments, the cover plates 42 include cover plates with light transmitting functions such as glass cover plates, or plastic cover plates, etc. Specifically, the surface of the cover plate 42 facing the encapsulation adhesive film 41 is a concave-convex surface, thereby increasing the utilization of incident light. The cover plates 42 include a first cover plate and a second cover plate, the first cover plate faces the first encapsulation layer, and the second cover plate faces the second encapsulation layer.

Although some embodiments of the present disclosure are provided in the above, but these embodiments are not intended to limit the claims, any person skilled in the art may make certain possible changes and modifications without departing from the conception of the present disclosure, and therefore the protection scope of the present disclosure shall be subject to the scope defined in the claims of the present disclosure. In addition, the embodiments in the specification and the accompanying drawings of the present disclosure are only illustrative examples, and are not intended to cover the entire protection scope of the claims in the present disclosure.

Any person of ordinary skill in the art can understand that the above embodiments are specific embodiments for realizing the present disclosure, and that in practical application, various changes may be made thereto in form and details without departing from the scope of the present disclosure. Any person skilled in the art may make various changes and modifications without departing from the scope of the present disclosure, and therefore the protection scope of the present disclosure shall be subject to the scope defined in the claims.

What is claimed is:

1. A solar cell comprising:
    a substrate having a first surface and a second surface opposite to each other;
    an emitter formed on the first surface of the substrate, wherein the emitter includes a textured structure on a side away from the first surface;
    a passivation structure formed on the textured structure of the emitter;
    first electrodes penetrating the passivation structure and in electrical contact with the textured structure of the emitter; and
    conductive eutectic layers, wherein each of the conductive eutectic layers is formed between a respective first electrode of the first electrodes and the emitter and includes first conductive particles and second conductive particles, and wherein each of the first conductive particles has a shape that is different from a shape of any of the second conductive particles, and the first conductive particles have branched shapes or linear shapes;
    wherein the first conductive particles and the second conductive particles have a first number, the first conductive particles have a second number, and a ratio of the second number to the first number is in a range of 20% to 80%.

2. The solar cell according to claim 1, wherein the ratio of the second number to the first number is in a range of 30% to 70%.

3. The solar cell according to claim 1, wherein the textured structure includes at least one protrusion structure having a dimension in a range of 100 nm to 10 um.

4. The solar cell according to claim 3, wherein the at least one protrusion structure includes a pyramid shape, a sinusoidal curve shape or a parabolic shape.

5. The solar cell according to claim 3, wherein each of the at least one protrusion structure includes a top portion and a bottom portion, the first conductive particles are located at the top portion and the bottom portion, and a number of the first conductive particles located at the top portion is greater than a number of the first conductive particles located at the bottom portion per unit area.

6. The solar cell according to claim 1, wherein the first conductive particles have a same material as the second conductive particles.

7. The solar cell according to claim 6, wherein the second conductive particles include agglomerates, and each of at least some of the agglomerates has a size in a range of 12 nm to 120 nm.

8. The solar cell according to claim 1, wherein the first conductive particles include silver nanoparticles or silver crystalline particles.

9. The solar cell according to claim 1, wherein each of at least some of the first conductive particles has a size in a range of 40 nm to 150 nm.

10. The solar cell according to claim 1, further comprising:
    a tunneling dielectric layer formed on the second surface;
    a first doped conductive layer formed on the tunneling dielectric layer;
    a first passivation layer formed on the first doped conductive layer; and
    second electrodes penetrating the first passivation layer and in electrical contact with the first doped conductive layer.

11. The solar cell according to claim 1, further comprising:
    an intrinsic passivation layer formed on the second surface;

a second doped conductive layer formed on the intrinsic passivation layer;

a transparent conductive layer formed on the second doped conductive layer; and second electrodes in electrical contact with the transparent conductive layer.

12. The solar cell according to claim 1, wherein the first electrodes and the conductive eutectic layers are prepared on a surface of the passivation structure away from the emitter by a screen printing process as well as an energy injection process.

13. The solar cell according to claim 12, wherein the energy injection process includes a laser process.

14. The solar cell according to claim 12, wherein the energy injection process is performed at a region of the passivation structure not overlapped with regions where the first electrodes are formed.

15. A photovoltaic module comprising:
at least one cell string each formed by connecting a plurality of solar cells;
at least one encapsulating adhesive film each configured to cover a surface of a respective cell string; and
at least one cover plate each configured to cover a surface of a respective encapsulating adhesive film facing away from the respective cell string;
wherein each of plurality of solar cells includes:
a substrate having a first surface and a second surface opposite to each other;
an emitter formed on the first surface of the substrate, wherein the emitter includes a textured structure on a side away from the first surface;
a passivation structure formed on the textured structure of the emitter;
first electrodes penetrating the passivation structure and in electrical contact with the textured structure of the emitter; and
conductive eutectic layers, wherein each of the conductive eutectic layers is formed between a respective first electrode of the first electrodes and the emitter and includes first conductive particles and second conductive particles, and wherein each of the first conductive particles has a shape that is different from a shape of any of the second conductive particles, and the first conductive particles have branched shapes or linear shapes;
wherein the first conductive particles and the second conductive particles have a first number, the first conductive particles have a second number, and a ratio of the second number to the first number is in a range of 20% to 80%.

16. The photovoltaic module according to claim 15, wherein the ratio of the second number to the first number is in a range of 30% to 70%.

17. The photovoltaic module according to claim 15, wherein the textured structure includes at least one protrusion structure having a dimension in a range of 100 nm to 10 um.

18. The photovoltaic module according to claim 17, wherein the at least one protrusion structure includes a pyramid shape, a sinusoidal curve shape or a parabolic shape.

19. The photovoltaic module according to claim 17, wherein each of the at least one protrusion structure includes a top portion and a bottom portion, the first conductive particles are located at the top portion and the bottom portion, and a number of the first conductive particles located at the top portion is greater than a number of the first conductive particles located at the bottom portion per unit area.

20. The photovoltaic module according to claim 15, wherein the first conductive particles have a same material as the second conductive particles.

* * * * *